US012685055B2

(12) United States Patent (10) Patent No.: US 12,685,055 B2
Park et al. (45) Date of Patent: Jul. 14, 2026

(54) SEMICONDUCTOR DEVICES AND METHODS OF MANUFACTURING THE SAME

(71) Applicant: Tokyo Electron Limited, Tokyo (JP)

(72) Inventors: Minjoon Park, Albany, NY (US); Alec Dorfner, Albany, NY (US); Matthew Ocana, Albany, NY (US); Andrew Metz, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 594 days.

(21) Appl. No.: 18/300,954

(22) Filed: Apr. 14, 2023

(65) Prior Publication Data

US 2024/0347346 A1 Oct. 17, 2024

(51) Int. Cl.
H10P 50/28 (2026.01)
H10P 50/00 (2026.01)
H10W 20/00 (2026.01)

(52) U.S. Cl.
CPC ............ H10P 50/283 (2026.01); H10P 50/73 (2026.01); H10W 20/089 (2026.01)

(58) Field of Classification Search
None
See application file for complete search history.

(56) References Cited

U.S. PATENT DOCUMENTS

| | | |
|---|---|---|
| 2011/0169125 A1 | 7/2011 | Reinmuth et al. |
| 2014/0377960 A1 | 12/2014 | Koiwa |
| 2019/0093626 A1* | 3/2019 | Díez Díez ................. F03D 1/06 |
| 2019/0362984 A1* | 11/2019 | Katsunuma ....... H01L 21/02238 |
| 2021/0005472 A1* | 1/2021 | Kanarik ........... H01L 21/67109 |
| 2022/0406613 A1 | 12/2022 | Takata et al. |

FOREIGN PATENT DOCUMENTS

KR      20120057463 A  *  6/2012  ............ H01L 21/76

OTHER PUBLICATIONS

International Search Report and Written Opinion dated May 23, 2024 on PCT App. PCT/US2024/012477 (10 pages).

* cited by examiner

*Primary Examiner* — Stephanie P Duclair
(74) *Attorney, Agent, or Firm* — Foley & Lardner LLP

(57) ABSTRACT

A method includes providing a semiconductor substrate having a first region and a second region. The method includes forming a stack of dielectric layers over the semiconductor substrate. The method includes patterning the stack to form first trenches over the first region and second trenches over the second region. The method further includes forming first conductive features having a first width in the first trenches and second conductive features having a second width in the second trenches, where the second width is less than the first width.

15 Claims, 29 Drawing Sheets

SEMICONDUCTOR DEVICES AND METHODS OF MANUFACTURING THE SAME

FILED OF THE DISCLOSURE

This disclosure relates to methods of manufacturing semiconductor devices and more particularly to methods of etching multiple dielectric layers with improved dimension control.

BACKGROUND

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. In recent development, it has become increasingly important to merge and/or compact fabrication steps to reduce processing complexity, cost, and/or time. However, as device features continue to decrease in critical dimensions (CD), many challenges arise with respect to combining different fabrication steps to achieve specific design goals. For example, merging various etching steps during the formation of interconnect features (e.g., plugs, vias, etc.) has been implemented to reduce processing complexity. While existing methods of such merging process have been generally adequate, they are not entirely satisfactory in all aspects.

SUMMARY

Described herein are methods of implementing etching processes for forming semiconductor devices.

In one aspect, the present disclosure provides a method that includes providing a semiconductor substrate having a first region and a second region. The method includes forming a stack of dielectric layers over the semiconductor substrate. The method includes patterning the stack to form first trenches over the first region and second trenches over the second region. The method further includes forming first conductive features having a first width in the first trenches and second conductive features having a second width in the second trenches, where the second width is less than the first width.

In some implementations, the patterning of the stack includes performing a first etching process to form the first and the second trenches to different depths. The patterning includes performing a second etching process using a tungsten-containing etchant to deepen the first and the second trenches to the same depth, thereby forming a tungsten-containing nitride layer in the first and the second trenches. The patterning further includes performing a third etching process to remove the tungsten-containing nitride layer.

In some implementations, the method further includes repeating the performing of the first etching process, the second etching process, and the third etching process before forming the first and the second conductive features.

In some implementations, the method further includes forming a first patterned mask and a second patterned mask over the stack in the first region and the second region, respectively, before the patterning of the stack, such that the performing of the first etching process is implemented using the first and the second patterned masks as etch masks. In some implementations, the first and the second patterned masks include an amorphous carbon layer. In some implementations, the first and the second patterned masks include tungsten silicide (WSi), tungsten silicon nitride (WSiN), or both.

In some implementations, the forming of the stack includes forming alternating oxide layers and nitride layers. In some implementations, the performing of the first etching process exposes a first nitride layer in the first trenches and a second nitride layer in the second trenches. In some implementations, the tungsten-containing etchant reacts with the first and the second nitride layers to form the tungsten-containing nitride layer.

In some implementations, the performing of the first etching process includes applying the tungsten-containing etchant at a first flow rate and the performing of the second etching process includes applying the tungsten-containing etchant at a second flow rate, where the second flow rate is greater than the first flow rate. In some implementations, the first flow rate is zero such that the first etching process is implemented without any tungsten-containing etchant.

In some implementations, the tungsten-containing etchant includes $WF_6$, and wherein the tungsten-containing nitride layer includes $W_2N$. In some implementations, the performing of the first etching process forms the first trenches at a first rate and the second trenches at a second rate that is less than the first rate. In some implementations, the performing of the second etching process forms the first trenches at a third rate and the second trenches at a fourth rate that is substantially the same as the third rate.

In some implementations, the performing of the third etching process includes applying a noble gas-containing etchant. In some implementations, the performing of the first etching process is implemented using an etchant including a fluorocarbon-based gas, a hydrofluorocarbon-based gas, or both.

In another aspect, the present disclosure provides a method that includes providing a semiconductor substrate having a first region and a second region. The method includes forming a stack of dielectric layers over the semiconductor substrate. The method includes etching the stack to form first trenches over the first region and second trenches over the second region, where the first and the second trenches have the same depth but different widths. The method further includes forming first conductive features having a first width in the first trenches and second conductive features having a second width in the second trenches, where the second width is less than the first width.

In some implementations, the method further includes removing the tungsten-containing nitride layer before forming the first and the second conductive features.

In some implementations, the method further includes forming a first patterned mask and a second patterned mask over the stack in the first region and the second region, respectively, before the patterning of the stack, such that the performing of the first etching process is implemented using the first and the second patterned masks as etch masks. In some implementations, the first and the second patterned masks include tungsten silicide (WSi), tungsten silicon nitride (WSiN), or both.

In some implementations, the etching is implemented using an etchant that includes a tungsten-containing gas (or etchant). In some implementations, the etching forms the first trenches at a first rate and the second trenches at a second rate that is substantially the same as the first rate. In some implementations, the etching includes forming a tungsten-containing nitride layer in the first and the second trenches.

In some implementations, the forming of the stack includes forming alternating oxide layers and nitride layers. In some implementations, the etching exposes a first nitride layer in the first trenches and a second nitride layer in the second trenches.

In yet another aspect, the present disclosure provides a method that includes providing a semiconductor substrate having a first region and a second region. The method includes forming a stack of alternating oxide layers and nitride layers over the semiconductor substrate. The method includes performing a first etching process to the stack to form first trenches over the first region and second trenches over the second region, where the first and the second trenches have different depths, and where the first etching process is implemented using a first etchant. The method includes performing a second etching process using a second etchant different from the first etchant to deepen the first and the second trenches to the same depth, resulting in a tungsten nitride-containing ($W_2N$) layer in the first and the second trenches. The method further includes, where the second etchant includes a $WF_6$-containing gas. The method includes performing a third etching process to remove the $W_2N$-containing layer. The method further includes forming first conductive features having a first width in the first trenches and second conductive features having a second width in the second trenches, where the second width is less than the first width.

In some implementations, the first etchant is substantially free of the $WF_6$-containing gas.

In some implementations, the method further includes repeating the performing of the first etching process, the second etching process, and the third etching process before forming the first and the second conductive features.

These and other aspects and implementations are discussed in detail below. The foregoing information and the following detailed description include illustrative examples of various aspects and implementations, and provide an overview or framework for understanding the nature and character of the claimed aspects and implementations. The drawings provide illustrations and a further understanding of the various aspects and implementations, and are incorporated in and constitute a part of this specification. Aspects can be combined, and it will be readily appreciated that features described in the context of one aspect of the invention can be combined with other aspects. Aspects can be implemented in any convenient form. As used in the specification and in the claims, the singular form of "a," "an," and "the" include plural referents unless the context clearly dictates otherwise.

BRIEF DESCRIPTION OF THE DRAWINGS

Non-limiting embodiments of the present disclosure are described by way of example with reference to the accompanying figures, which are schematic and are not intended to be drawn to scale. Unless indicated as representing the background art, the figures represent aspects of the disclosure. For purposes of clarity, not every component may be labeled in every drawing. In the drawings.

DETAILED DESCRIPTION

Figure 1:
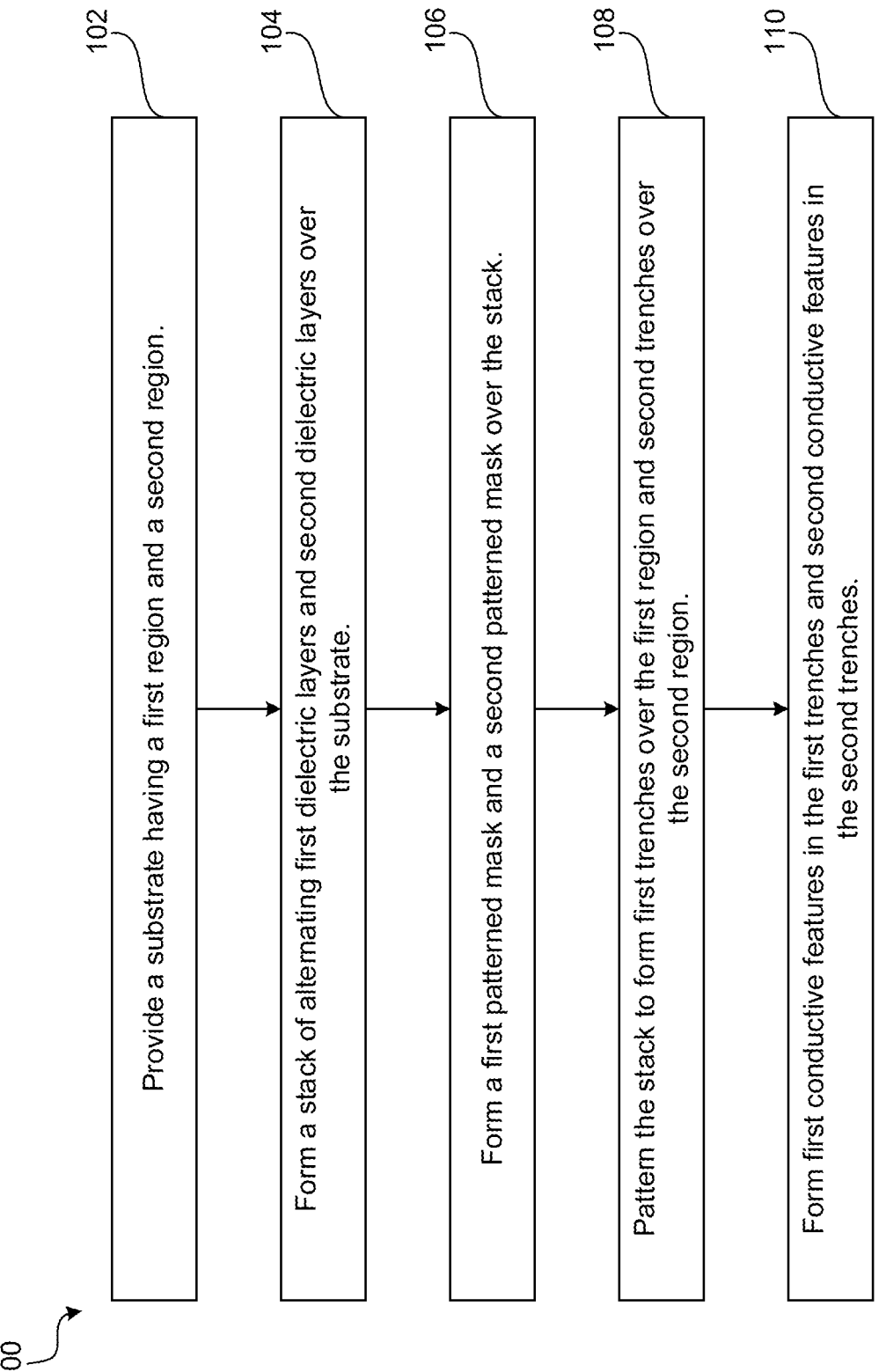
FIGS. 1, 2A, and 2B each illustrate a flowchart of an example method of fabricating a semiconductor structure, in accordance with some implementations.

Reference will now be made to the illustrative embodiments depicted in the drawings, and specific language will be used here to describe the same. It will nevertheless be understood that no limitation of the scope of the claims or this disclosure is thereby intended. Alterations and further modifications of the inventive features illustrated herein, and additional applications of the principles of the subject matter illustrated herein, which would occur to one skilled in the relevant art and having possession of this disclosure, are to be considered within the scope of the subject matter disclosed herein. Other embodiments may be used or other changes may be made without departing from the spirit or scope of the present disclosure. The illustrative embodiments described in the detailed description are not meant to be limiting of the subject matter presented.

Figure 2A:
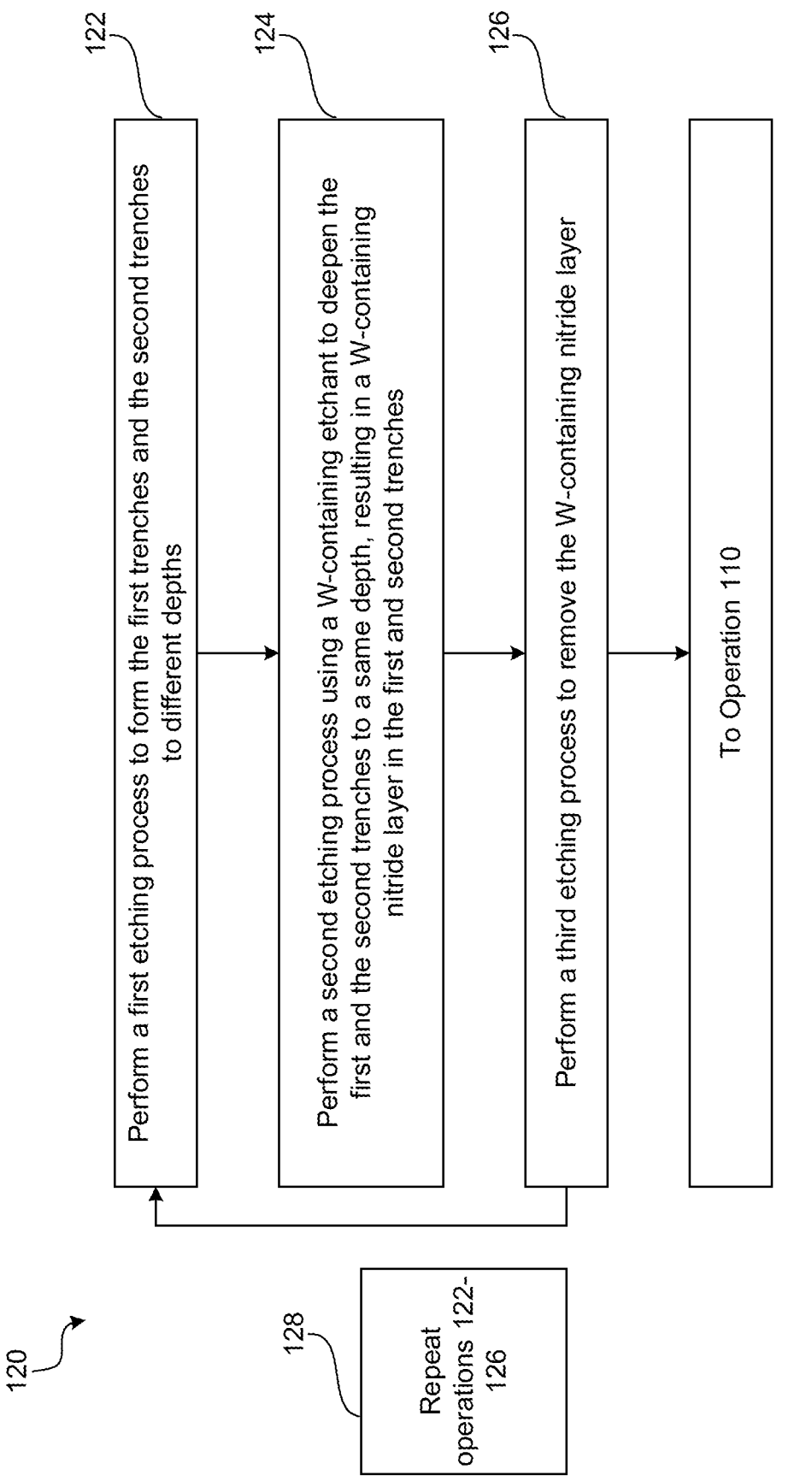
Figure 2B:
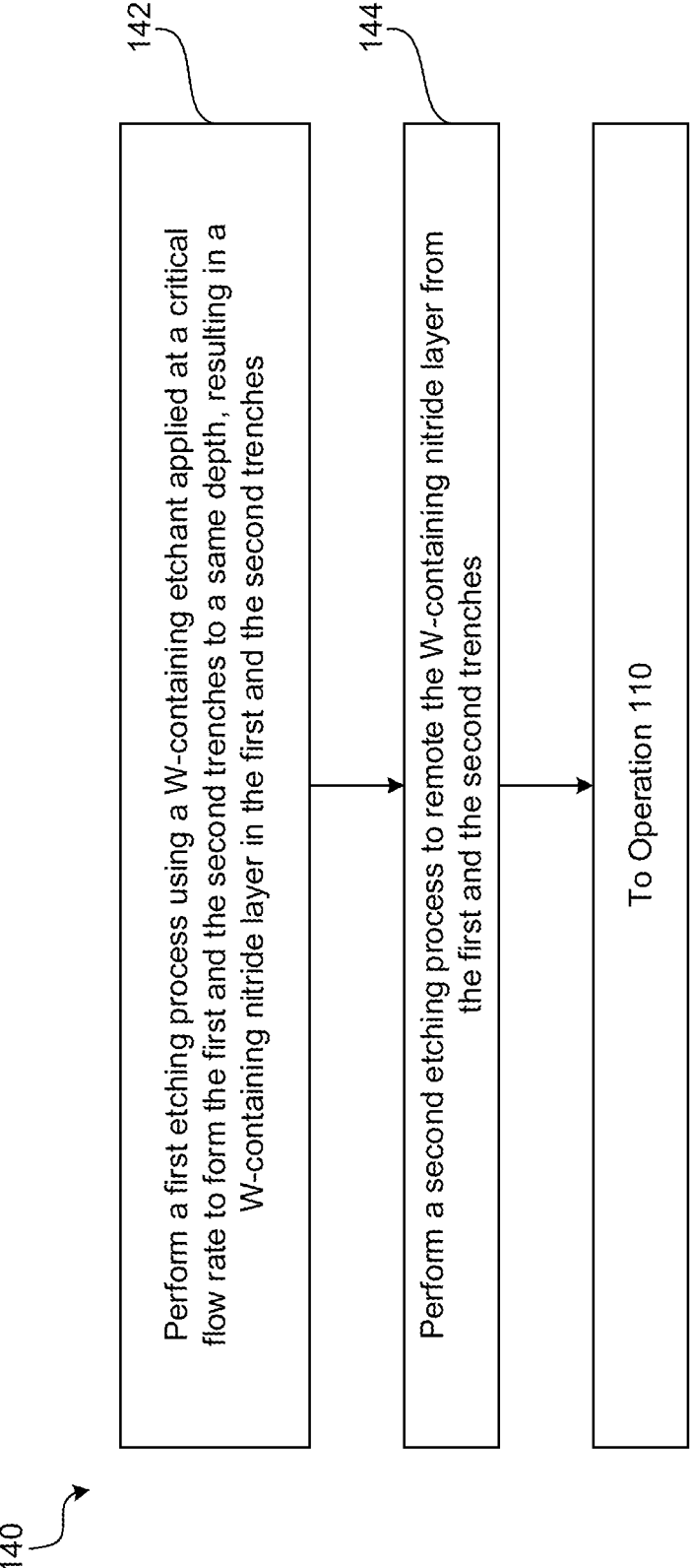

FIG. 1 illustrates a flowchart of an example method 100 for processing a semiconductor structure using a patterned stack of dielectric layers, according to some implementations of the present disclosure. FIGS. 2A-2B illustrate flowcharts of example methods 120 and 140, respectively, for implementing a portion (e.g., one or more operations) of the method 100, according to some implementations of the present disclosure. The method 100, 120, and 140 are described in reference to FIGS. 3-6F and 9A-14C, which illustrate cross-sectional side views and corresponding planar top views of a semiconductor structure 200 during intermediate steps of the methods 100, 120, and/or 140, according to some implementations of the present disclosure. It is noted that the methods 100, 120, and 140 are merely examples and are not intended to limit the present disclosure. It is further understood that additional operations may be provided before, during, and after each of the methods 100, 120, and 140 and that some other operations may only be briefly described herein.

Figure 3:
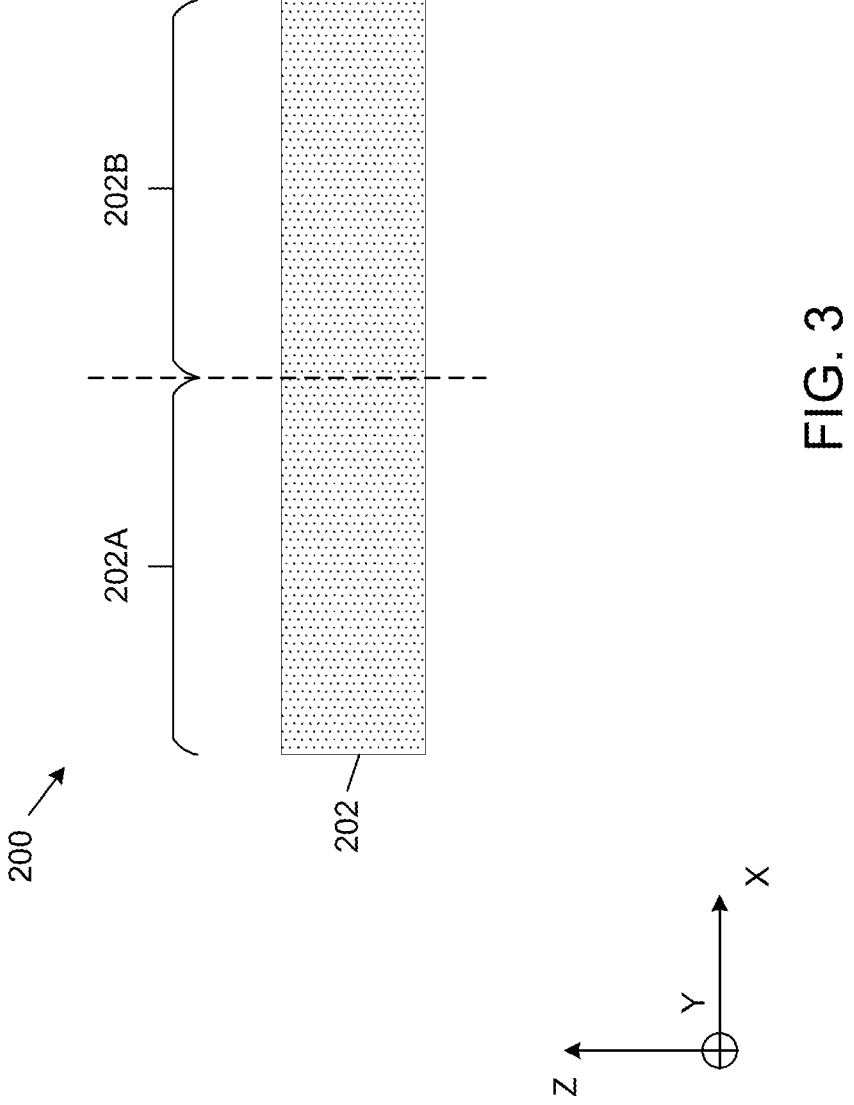
FIGS. 3, 4, 5, 6A, 6B, 6C, 6D, 6E, 6F, 9A, 9B, 10, 11, 12A, 12B, 12C, 12D, 13A, 13B, 13C, 13D, 14A, 14B, and 14C each illustrate a cross-sectional side view of an example semiconductor structure at intermediate steps of the method illustrated in one or more of FIGS. 1, 2A, and 2B, in accordance with some implementations.

Referring to FIGS. 1 and 3, the method 100 at operation 102 provides the semiconductor structure 200 that includes a substrate 202.

The substrate 202 may include a semiconductor material, such as a bulk semiconductor, a semiconductor-on-insulator (SOI), or the like, which may be doped (e.g., with a p-type or an n-type dopant) or undoped. The substrate 202 may be or correspond to a wafer (e.g., 202 or 206), such as a silicon wafer. Generally, an SOI includes a layer of a semiconductor material formed on an insulator layer. The insulator layer may be, for example, a buried oxide (BOX) layer, a silicon oxide layer, or the like. The substrate 202 may include other semiconductor materials, such as a multi-layered or gradient semiconductor material. In some examples, the substrate 202 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; other suitable materials; or combinations thereof.

In the present implementations, the substrate 202 includes a first region 202A and a second region 202B, each of which may be configured to provide a number of device features (e.g., transistors, diodes, resistors, etc.; not depicted for purposes of simplicity) within and/or over the substrate 202. Example transistors may include field-effect transistors (FETs) such as fin-like FET (e.g., FinFET), multi-gate FETs, nanosheet FETs, the like, or combinations thereof. The device features may include doped or undoped semiconductor materials, which may be similar in composition as the substrate 202.

The semiconductor structure 200 may further include a number of interconnect structures (alternatively referred to as conductive features, such as vias and conductive lines) formed over the device features provided on the substrate 202. The interconnect structures may be configured to electrically connect the device features to one another so as to form an integrated circuit, which can function as a logic device, a memory device, an input/output device, or the like. The interconnect structures may include a conductive material, such as Cu, tungsten (W), nickel (Ni), aluminum (Al), ruthenium (Ru), silver (Ag), gold (Au), platinum (Pt), titanium (Ti), tantalum (Ta), TiN, TaN, the like, or combinations thereof, disposed in a dielectric (e.g., insulating) material, such as oxide, nitride, carbide, the like, or combinations thereof. The device features and the interconnect structures may be formed within various dielectric layers (e.g., inter-metal dielectric layers, interlevel/interlayer dielectric layers, etch-stop layers, etc.) over the substrate 202.

Figure 4:
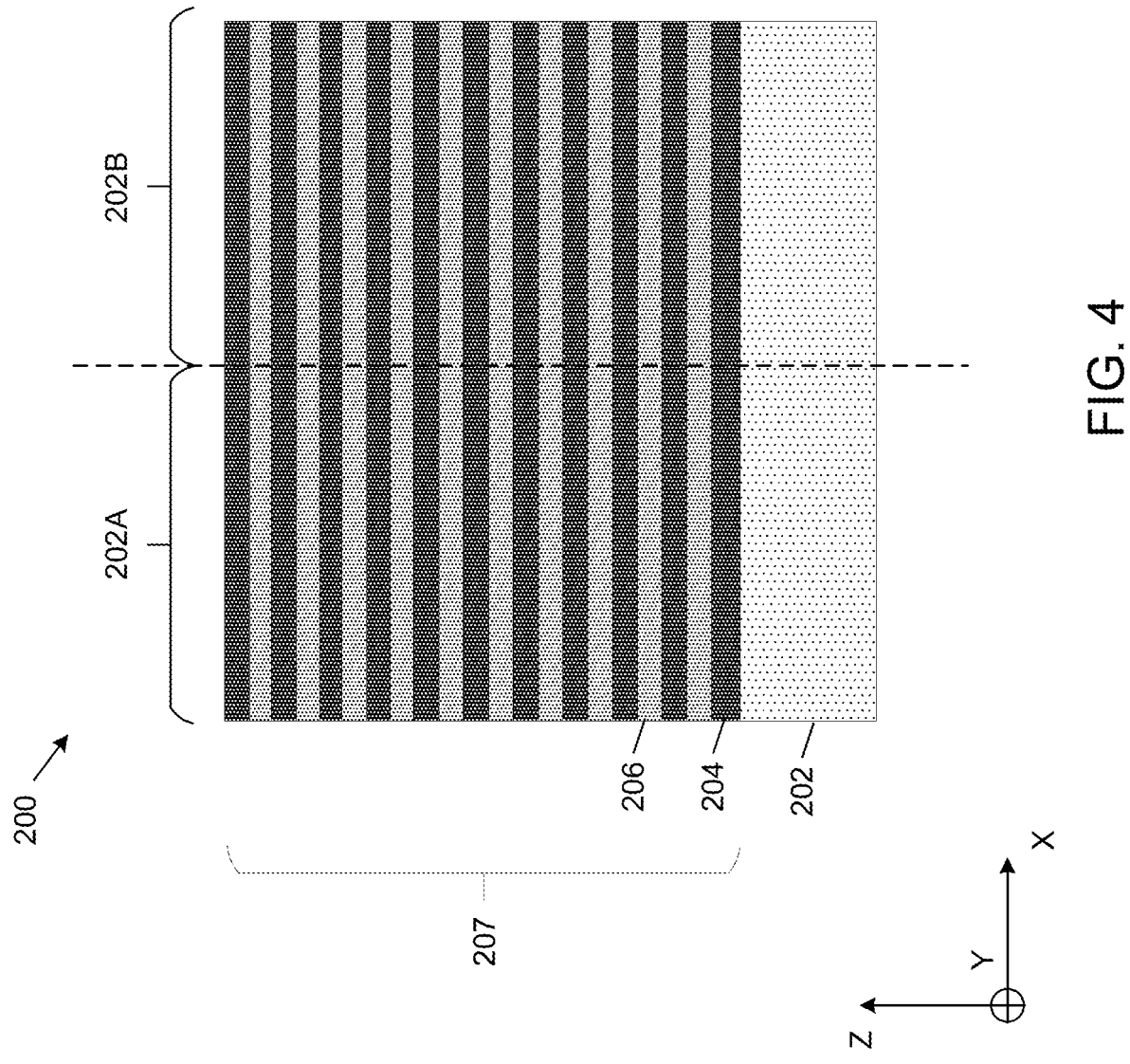

Referring to FIGS. 2 and 4, the method 100 at operation 104 forms a stack 207 of alternating dielectric layers (e.g., insulating layer) 206 and dielectric layers (e.g., insulating layer) 204 on or overlaying the substrate 202.

In the present implementations, the dielectric layers 204 and 206 differ in composition. In this regard, the dielectric layer 204 may include a nitride-containing material, such as silicon nitride (SiN), silicon carbo-nitride (SiCN), the like, or combinations thereof, and the dielectric layer 206 may include an oxide-containing material, such as silicon oxide (SiO$_2$). In some implementations, the dielectric layer 206 includes an oxide-containing low-k dielectric material (e.g., a dielectric material having a dielectric constant less than that of silicon oxide, which is about 3.9). The dielectric layers 204 and 206 may be formed or deposited in an alternating configuration, using at least one suitable deposition technique, such as chemical vapor deposition (CVD), flowable CVD (FCVD), atomic layer deposition (ALD), physical vapor deposition (PVD), spin coating, the like, or combinations thereof. In some examples, the dielectric layers 204 and 206 may be formed to difference thicknesses.

Figure 5:
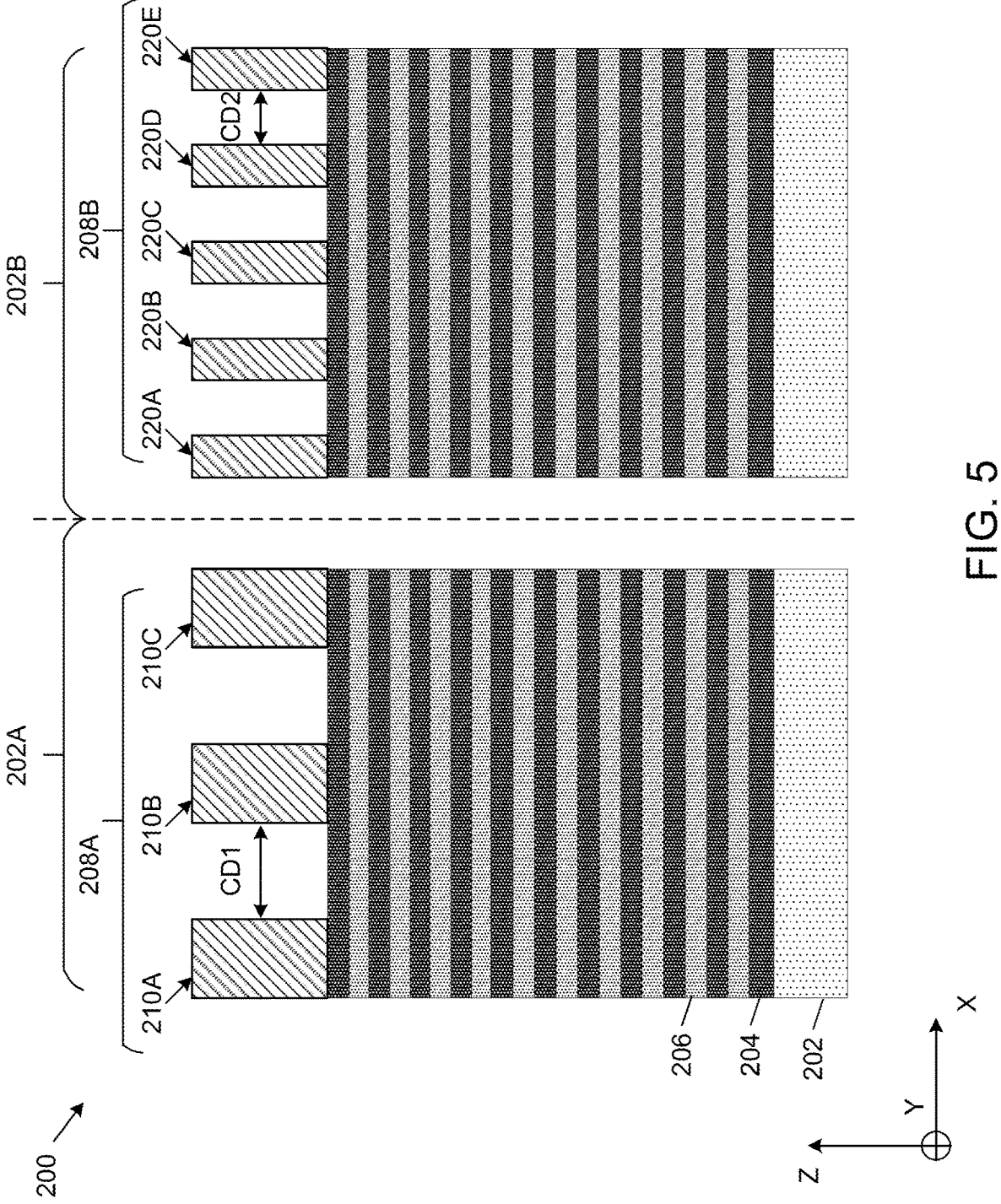

Referring to FIGS. 1 and 5, the method 100 at operation 106 forms a first patterned mask 208A and a second patterned mask 208B over the stack 207.

As shown, the first patterned mask 208A is formed over the first region 202A and the second patterned mask 208B is formed over the second region 202B, where the patterned masks 208A and 208B include patterns having different critical dimensions. For example, the first patterned mask 208A includes patterns 210A, 210B, and 210C separated by CD1, which defines a critical dimension of a conductive feature subsequently formed over the first region 202A. Similarly, the second patterned mask 208B includes patterns 220A, 220B, 220C, 220D, and 220E separated by CD2, which differs from the CD1 and defines a critical dimension of a conductive feature subsequently formed over the second region 202B. In the depicted implementations, the CD1 is greater than the CD2, indicating that the conductive features formed over the first region 202A have a greater width than those formed over the second region 202B.

In the present implementations, the respective patterns of the first patterned mask 208A and the second patterned mask 208B are subsequently transferred to the stack 207 by a series of etching processes, thereby defining trenches in the stack 207 having lateral dimensions (e.g., dimensions along the X-axis) corresponding to the CD1 and the CD2 over the first region 202A and the second region 202B, respectively. In this regard, the difference between the CD1 and the CD2 may cause a difference in etching rate during one or more of the etching processes, leading to the trenches formed over the first region 202A and the second region 202B having varying vertical dimensions (e.g., depths along the Z-axis). Accor dining to some non-limiting examples of the present disclosure, the difference between the CD1 and the CD2 may be about 60 nm to about 300 nm.

In some implementations, such as in the fabrication of devices (e.g., NAND memory), different features configured with different CDs may be formed together by merging various fabrication steps to reduce processing complexity, time, and/or cost. Non-limiting examples of such features may include conductive plugs, dummy plugs, slit, vias, or the like. In many instances, it is important that such features are formed to generally the same depths (or heights), despite their different CDs, to ensure proper routing and connectivity with overlaying and/or underlying features. In this regard, variations in etching rate between trenches of different dimensions may inadvertently cause variations in the depths of the resulting features, thereby inadvertently affecting the performance of the devices. For at least those reason, improvements in the method of reducing differences in the etching rates between trenches of different dimensions are desired.

In the present implementations, the first patterned mask 208A and the second patterned mask 208B have the same composition and structure and may be formed by any suitable method. For example, the first patterned mask 208A and the second patterned mask 208B may be formed using a series of lithography and etching processes, which include forming a photoresist layer (not depicted) over each mask, exposing the photoresist layer to a suitable light source, developing each photoresist layer to form a patterned photoresist layer, etching each mask using the patterned photoresist layers as etch masks to form the first patterned mask 208A and the second patterned mask 208B, respectively, and subsequently removing the patterned photoresist layers by a suitable method, such as resist stripping or plasma ashing. In some implementations, the first patterned mask 208A and the second patterned mask 208B may be formed as two separated patterned masks, i.e., they may be formed by separate patterning processes. Alternatively, the first patterned mask 208A and the second patterned mask 208B may be formed as two portions of a single, continuous patterned mask, i.e., they may be formed simultaneously or concurrently by the same patterning process.

In the present implementations, the first patterned mask 208A and the second patterned mask 208B each include a dielectric material having a composition different from that of the dielectric layers 204 and 206. For example, the first patterned mask 208A and the second patterned mask 208B may each include an amorphous carbon layer (ACL). In this regard, the first patterned mask 208A and the second patterned mask 208B exhibit certain etching selectivity with respect to the dielectric layers 204 and 206, so as to be configured to remain, or substantially remain, over the stack 207 throughout the subsequent etching processes.

Referring to FIG. 1, the method 100 at operation 108 subsequently patterns the stack 207 to form first trenches (or openings) 216A and 216B over the first region 202A using the first patterned mask 208A as an etch mask and second trenches 226A, 226B, 226C, and 226D over the second region 202B using the second patterned mask 208B as an etch mask. Operation 108 may be implemented by a variety of processes described in detail below.

In some implementations, referring to FIGS. 6A-6F collectively, operation 108 may be implemented using the method 120 depicted in FIG. 2A, for example.

Figure 6A:
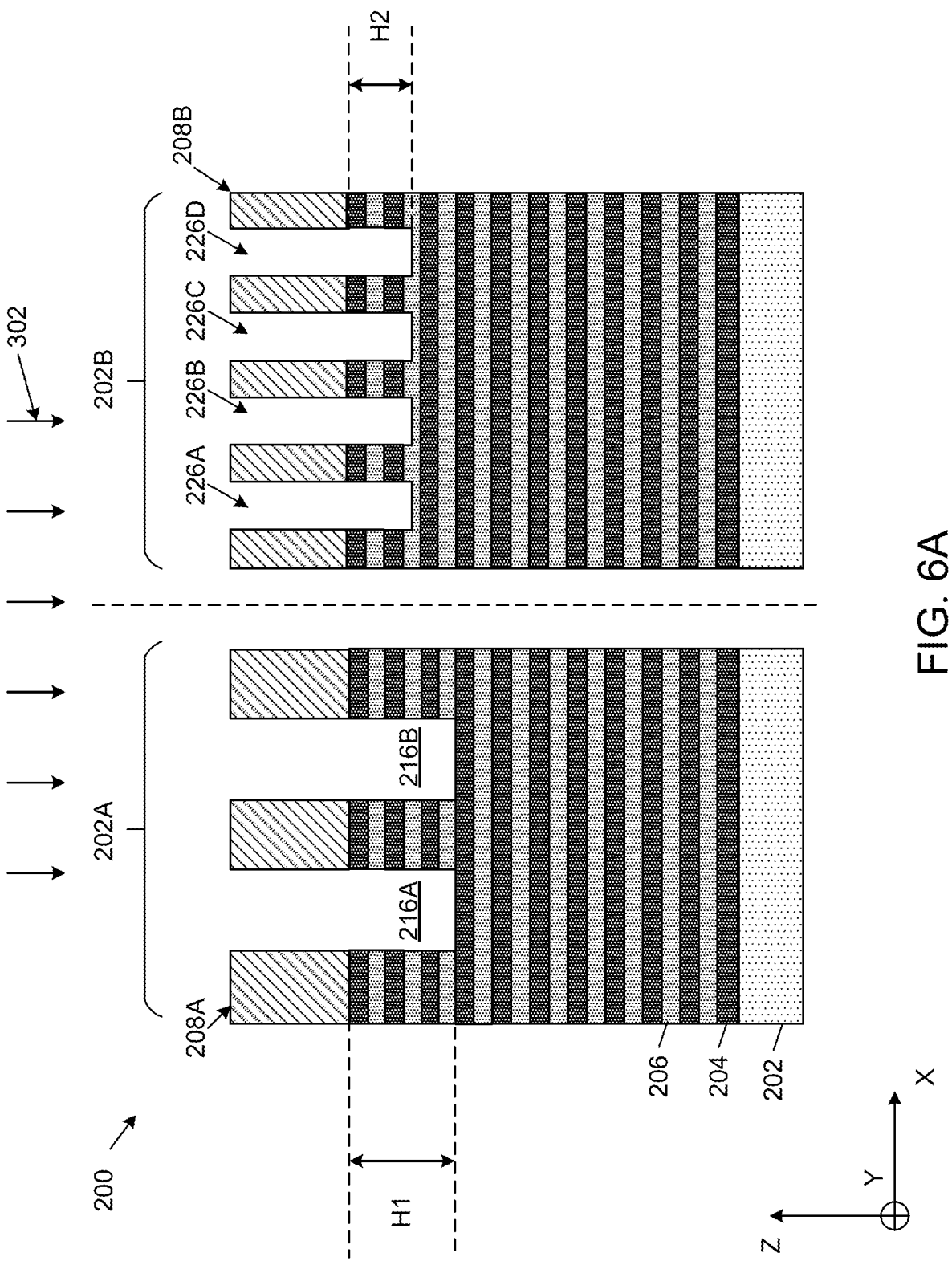

Referring to FIGS. 2A and 6A, the method 120 at operation 122 performs a first etching process 302 to form the first trenches 216A-216B using the first patterned mask 208A as an etch mask and second trenches 226A-226D using the second patterned mask 208B as an etch mask.

The first etching process 302 may be any suitable etching process, such as a dry etching process implemented using a chemically reactive plasma. In this regard, the first etching process 302 is considered a reactive ion etching (RIE) process. In some implementations, the first etching process 302 is performed using a plasma that includes any suitable etchant configured to react with both the dielectric layers 204 and 206 in the stack 207. For example, the plasma may be formed from a fluorine-based gas (or etchant), such as a fluorocarbon-based gas, a hydrofluorocarbon-based gas, or both. Non-limiting examples of the fluorine-based gas include $CF_4$, $CHF_3$, $CH_3F$, $CH_2F_2$, $C_2F_6$, $C_3F_8$, $C_4F_6$, $C_4F_8$, $SF_6$, $SiF_4$, $SiCl_4$, $NF_3$, $ClF_3$, the like, or combinations thereof. Other etchants may also be applicable according to implementations of the present disclosure. In some implementations, the plasma additionally includes oxygen ($O_2$). In some implementations, the plasma removes the dielectric layer 206 at a rate different from that of the dielectric layer 204. In some implementations, the plasma is free, or substantially free, of any tungsten-containing etchant (or gas), such as tungsten fluoride ($WF_6$).

In the present implementations, the rate (e.g., an etching rate ER1) at which the stack 207 is removed in the first trenches 216A-216B differs from the rate (e.g., an etching rate ER2) at which the stack 207 is removed in the second trenches 226A-226D. For example, because the CD1 is greater than the CD2, the plasma enters and reacts with the stack 207 in the first trenches 216A-216B at a greater rate than the plasma does in the second trenches 226A-226D during the first etching process 302. As a result, the ER1 is greater than the ER2, such that the etching rate is positively correlated with the dimension of the trenches. In other words, after implementing the first etching process 302 for a fixed duration of time, a depth H1 of the first trenches 216A-216B is greater than a depth H2 of the second trenches 226A-226D as shown in FIG. 6A. Such lag in etching rate may be termed RIE-lag in the context of the RIE process.

In some instances, should the first etching process 302 be allowed to continue, the resulting first trenches 216A-216B over the first region 202A and the resulting second trenches 226A-226D over the second region 202B are formed to different depths, which may negatively impact the connectivity between the respective conductive features subsequently-formed in the first trenches 216A-216B and the second trenches 226A-226D and any underlying device features (e.g., interconnect features, front-end-of-line (FEOL) device features, etc.). In some implementations, the lag in the etching rate may be additionally or alternatively caused by a difference in composition between the dielectric layers (e.g., the dielectric layers 204 and 206) of the stack 207, which may lead to a difference in the etching rate of the dielectric layers using the plasma of the first etching process 302.

In some implementations, due to the lag in the etching rate, the first etching process 302 may stop on different dielectric layers of the stack 207 between the first trenches 216A-216B and the second trenches 226A-226D. For example, the first etching process 302 may stop on (or expose) the dielectric layer 204 in the first trenches 216A-216B and stop on (or expose) the dielectric layer 206 in the second trenches 226A-226D. Alternatively, the first etching process 302 may stop on the same dielectric layer (e.g., the dielectric layer 205 or the dielectric layer 206) of the stack 207 in both the first trenches 216A-216B and the second trenches 226A-226D.

Figure 6B:
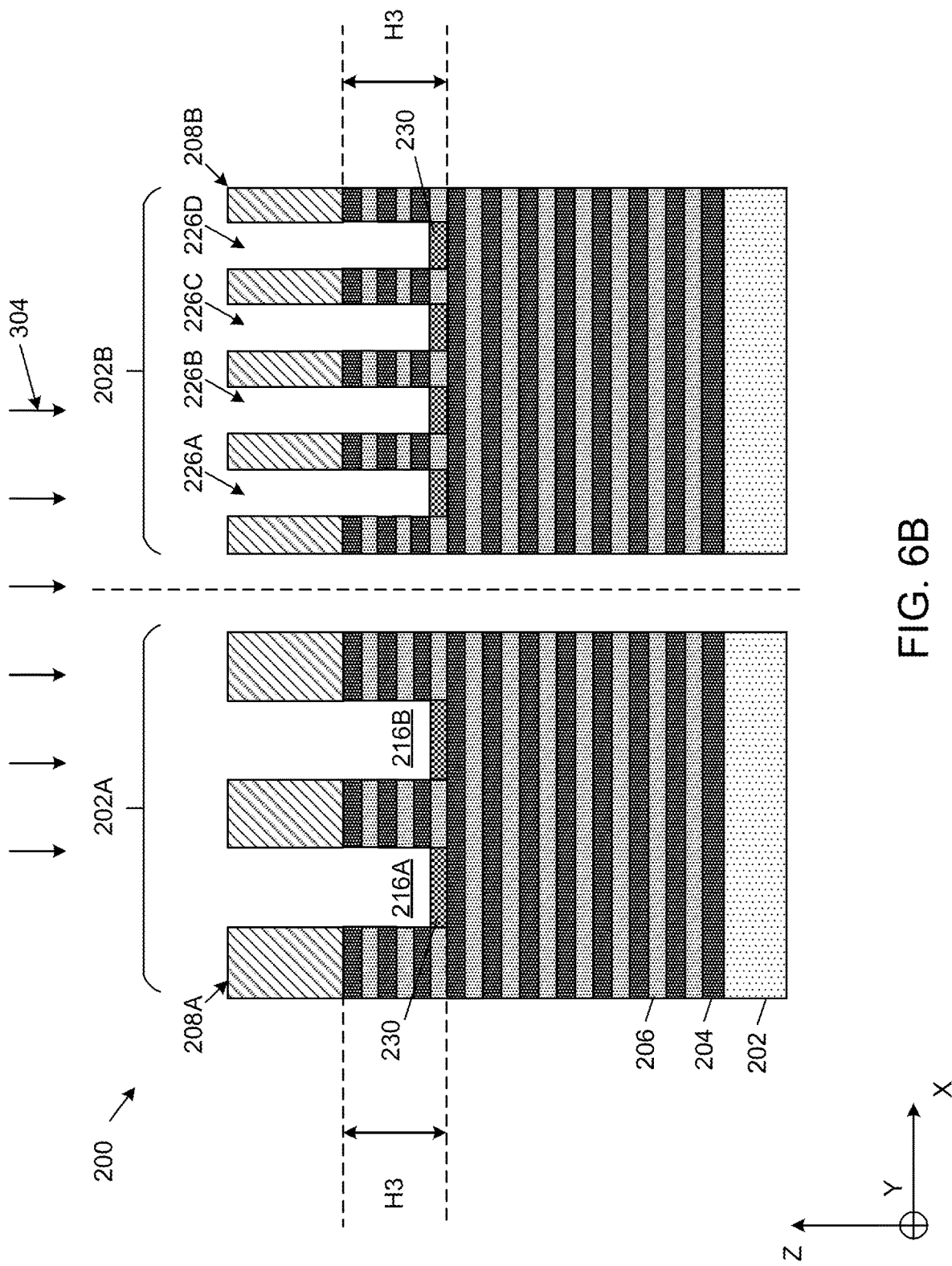

Referring to FIGS. 2A and 6B, the method 120 at operation 124 performs a second etching process 304 to deepen the first trenches 216A-216B and the second trenches 226A-226D.

Similar to the first etching process 302, the second etching process 304 may be an RIE process implemented using a chemically reactive plasma. In the present implementations, the second etching process 304 is performed using a plasma that includes a first etchant that is similar to the etchant used in the first etching process 302. For example, the first etchant may include a fluorine-containing etchant provided herein, oxygen, the like, or combinations thereof. The plasma used for the second etching process 304 further includes a second etchant different from the first etchant, where the second etchant is configured to selectively react with the dielectric layer 204 but not, or not substantially, with the dielectric layer 206. For implementations in which the dielectric layer 204 includes a nitride material (e.g., silicon nitride), the second etchant includes a tungsten-containing etchant (or gas), such as $WF_6$. In some implementations, the plasma used in the second etching process 304 may further include nitrogen gas ($N_2$) to assist the reaction between the second etchant and the dielectric layer 204. In some examples, the first etching process 302 and the second etching process 304 are implemented for the same duration of time.

As a result, a first suboperation of the second etching process 304 is implemented using the first etchant and configured to deepen both the first trenches 216A-216B and the second trenches 226A-226D by removing the dielectric layers 204 and 206, a process similar to the first etching process 302. Accordingly, the etching rate of the stack 207 in the first trenches 216A-216B and the second trenches 226A-226D is consistent with the ER1 and the ER2, respectively, of the first etching process 302.

Subsequently and/or concurrently, a second suboperation of the second etching process 304 is implemented using the second etchant, which includes the tungsten-containing etchant, and configured to selectively react with nitrogen of the dielectric layer 204 (e.g., as it is being exposed by the first suboperation of the second etching process 304) and/or from the applied nitrogen to form a tungsten-containing nitride layer ($W_2N$) 230 and one or more polymer-based etching byproduct(s) in both the first trenches 216A-216B and the second trenches 226A-226D. In some implementations, the tungsten-containing nitride layer 230 is formed to a thickness that is less than about 10 nm. In this regard, the tungsten-containing nitride layer 230 and the polymer-based etching byproduct are formed in the first trenches 216A-216B at a forming rate FR1, and the tungsten-containing nitride layer 230 and the polymer-based etching byproduct are formed in the second trenches 226A-226D at a forming rate FR2 that is different from the FR1.

An effective etching rate ER1' and ER2' at which the first trenches 216A-216B and the second trenches 226A-226D, respectively, deepen takes into account both the etching rates ER1 and ER2 and their corresponding forming rates FR1 and FR2, all resulting from the second etching process 304. In the present implementations, the forming of the tungsten-containing nitride layer 230 and any polymer-based etching byproduct in the trenches retards the removal of the stack 207 in the trenches, thereby lowering the effective rate at which the trenches deepen. At the first etching process 302, a difference in the etching rate (e.g., ER1−ER2) between the first trenches 216A-216B and the second trenches 226A-226D results in a difference (e.g., H1−H2) in the depths of the respective trenches. As such, in order to reduce (e.g., minimize) such a difference in depth and achieve substantially the same depth in both the first trenches 216A-216B and the second trenches 226A-226D, parameters of the second etching process 304 are tuned to ensure that the effective etching rate ER1' in the first trenches 216A-216B is substantially the same as the effective rate ER2' in the second trenches 226A-226D.

As described in detail above with respect to the first etching process 302, the etching rate ER1 is greater than the etching rate ER2 due to CD1 being greater than CD2. Similarly, with CD1 being greater than CD2, the amount of the tungsten-containing nitride layer 230 and any polymer-based etching byproduct formed over a given period of time in the first trenches 216A-216B (e.g., the FR1) is also greater than that (e.g., the FR2) in the second trenches 226A-226D during the second etching process 304. In this regard, by introducing the second etchant containing $WF_6$, the higher etching rate ER1 may be counterbalanced or retarded to a greater extent by the higher forming rate FR1 to reach the effective etching rate ER1', and the lower etching rate ER2 may be retarded to a lesser extent by the lower forming rate FR2 in the second trenches 226A-226D to reach the effective etching rate ER2' that is substantially the same as the effective etching rate ER1'. The resulting depths of the first trenches 216A-216B and the second trenches 226A-226D are therefore substantially the same as each other, e.g., both at a depth H3 as shown in FIG. 6B. If the etching rate ER1 is similar to the forming rate FR1, i.e., the forming of the tungsten-containing nitride layer 230 and any polymer-based etching byproduct completely fills any opening created by the etching of the stack 207, then the depth H3 may be similar to the depth H1. Alternatively, if the etching rate ER1 is greater than the forming rate FR1, then the depth H3 may be greater than or equal to the depth H1.

Subsequently, referring to FIGS. 2A and 6C, the method 120 at operation 126 performs a third etching process 306 to remove the tungsten-containing nitride layer 230.

In the present implementations, the tungsten-containing nitride layer 230 formed as a result of the second etching process 304 is removed from the first trenches 216A-216B and the second trenches 226A-226D by the third etching process 306. Such a process may be termed a punch-through process, which describes the etching of the tungsten-containing nitride layer 230 to expose the underlying dielectric layer 206 by a subsequent etching process (e.g., the repeated operation 122). The third etching process 306 may be implemented using an etchant including a noble gas, such as Ar, Kr, the like, or combinations thereof. In some examples, the third etching process 306 may be implemented using an etchant including a fluorine-containing etchant, such as $NF_3$.

Figure 7:
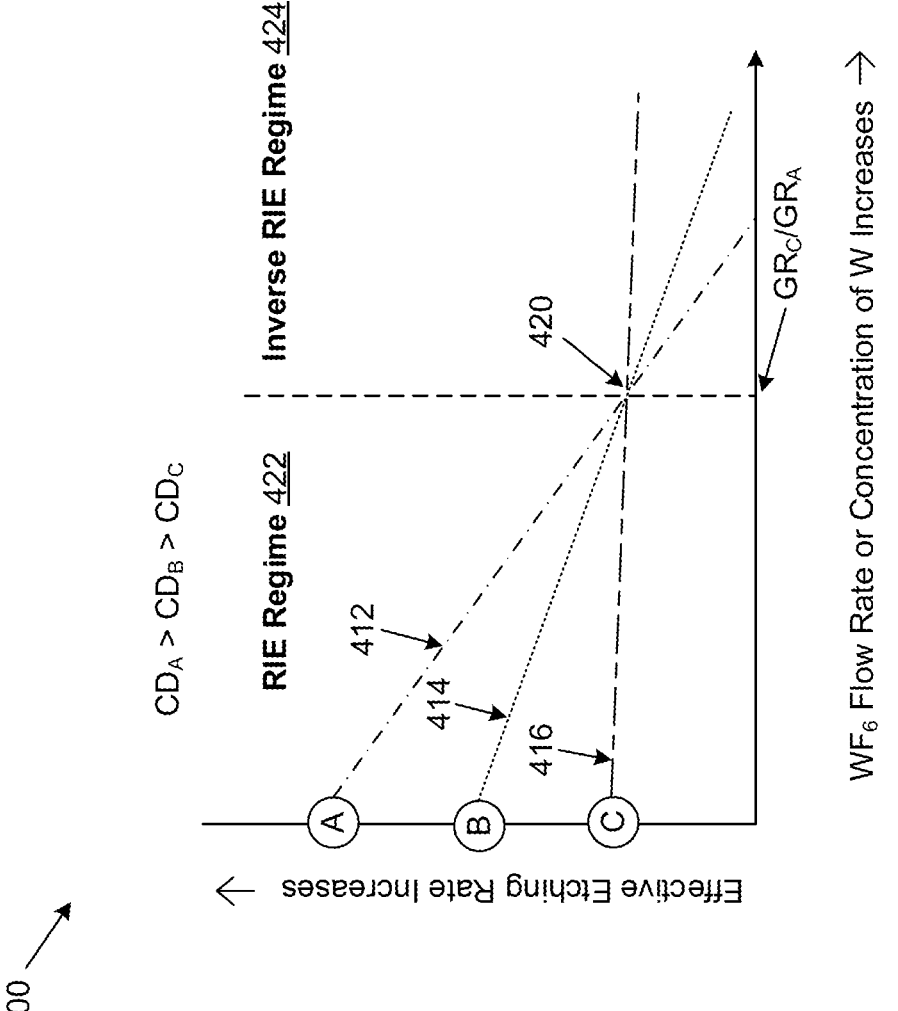
FIGS. 7 and 8 each illustrate a schematic graph of a relationship between etching rate and flow rate of a tungsten fluoride ($WF_6$) gas or concentration of tungsten (W) at one or more intermediate steps of the method illustrated in one or more of FIGS. 1, 2A, and 2B, in accordance with some implementations.

In the present implementations, the effective etching rate may be adjusted by tuning a flow rate of the tungsten-containing etchant (or tungsten-containing gas), such as $WF_6$, used in the first etching process 302 and the second etching process 304. For example, FIG. 7 illustrates a schematic plot 400 depicting changes in the effective etching rate (e.g., in mm/s) of a nitride material (e.g., the dielectric layer 204) as a function of the flow rate (e.g., in sccm) of the tungsten-containing etchant in trenches of different dimensions (e.g., widths), such as $CD_A$, $CD_B$, and $CD_C$, where $CD_A > CD_B > CD_C$. As shown by the trends of datasets 412, 414, and 416, which correspond to the different dimensions $CD_A$, $CD_B$, and $CD_C$, respectively, the effective etching rate of the nitride material in a given trench decreases as the flow rate of the tungsten-containing etchant increases. The increase in the flow rate of the tungsten-containing etchant increases an amount of the tungsten-containing nitride layer 230 and any polymer-based etching byproduct formed in the trenches, thereby increasing the forming rate therein.

As shown, the three datasets 412-416 intersect at a crossover point 420 corresponding to a critical flow rate $GR_C$. In some examples, the $GR_C$ may be greater than 0 but less than or equal to about 5 sccm, depending on the etching recipes employed for the first etching process 301 and/or the second etching process 304. At a flow rate below the $GR_C$, the effective etching rate decreases as the dimension of the trench decreases, and at a flow rate above the $GR_C$, the effective etching rate increases as the dimension of the trench increases. In this regard, the schematic plot 400 includes an RIE regime 422 over a range of the flow rates below the $GR_C$ for which the effective etching rate is positively correlated with the dimensions of the trenches, and an inverse RIE (alternatively referred to as an i-RIE) regime 424 over a range of the flow rates above the $GR_C$ for which the effective etching rate is inversely correlated with the dimensions of the trenches.

In the present disclosure, the first etching process 302 is implemented at a flow rate below the $GR_C$, i.e., in the RIE regime 422 where the effective etching rate is positively correlated with the dimensions of the trenches, and the second etching process 304 is implemented at a flow rate above the $GR_C$, i.e., in the i-RIE regime 424 where the effective etching rate is inversely correlated with the dimensions of the trenches. For example, the first etching process 302 may be implemented without applying any of the second etchant, i.e., the flow rate is approximately zero, such that changes in the effective etching rate in trenches of different dimensions are described by the vertical axis of the schematic plot 400.

As described in detail above, such changes in the effective etching rate when transitioning from the RIE regime 422 to the i-RIE regime 424 may be attributed to the formation of the tungsten-containing nitride layer 230 and any polymer-based etching byproduct in the trenches. Accordingly, by applying the first etching process 302 and the second etching process 304 in a cyclic manner (e.g., repeating operations 122-126), the effective etching rates ER1' and ER2' can be adjusted to substantially the same level, thereby reducing or minimizing the difference between the depths of the first trenches 216A-216B and the second trenches 226A-226D.

Figure 8:
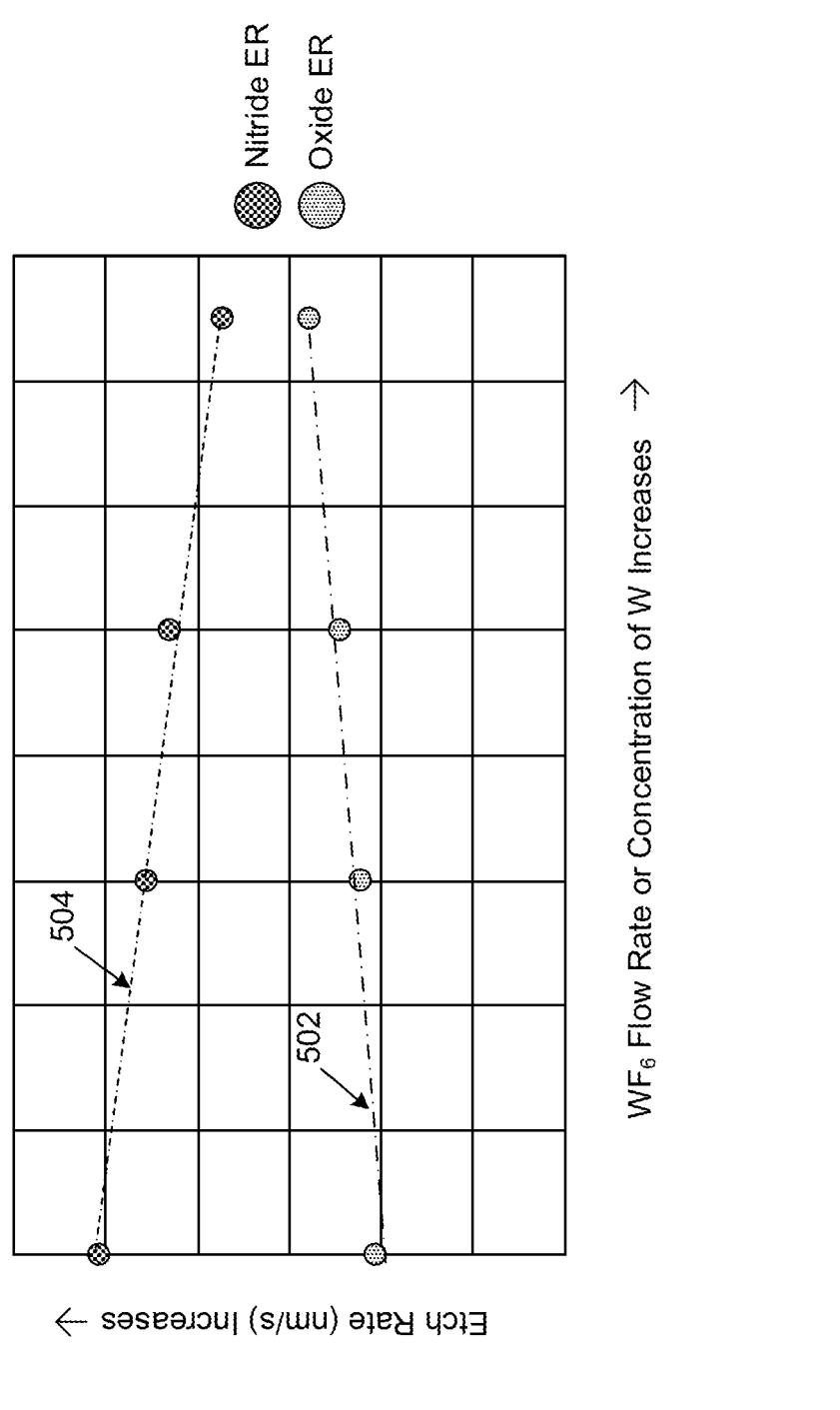

Furthermore, FIG. 8 illustrates a schematic plot 500 depicting changes in the etching rate (e.g., in mm/s) as a function of the flow rate (e.g., in sccm) of the tungsten-containing etchant, such as $WF_6$, used in the second etching process 304. Dataset 502 describes a generally increasing trend of the etching rate in a trench as a function of the flow rate for the dielectric layer 206 (e.g., containing an oxide material), and dataset 504 describes a generally decreasing trend of the etching rate in the trench as a function of the flow rate for the dielectric layer 204 (e.g., containing a nitride material). In this regard, the tungsten-containing etchant is shown to reduce the etching rate by selectively reacting with the nitride material of the dielectric layer 204 to form the tungsten-containing nitride layer 230 and the polymer-based etching byproduct. In contrast, the oxide material of the dielectric layer 206, however, does not form, or substantially form, an etching product (and/or byproduct) to retard the etching rate in the trench, resulting in the generally increasing trend.

Figure 10:
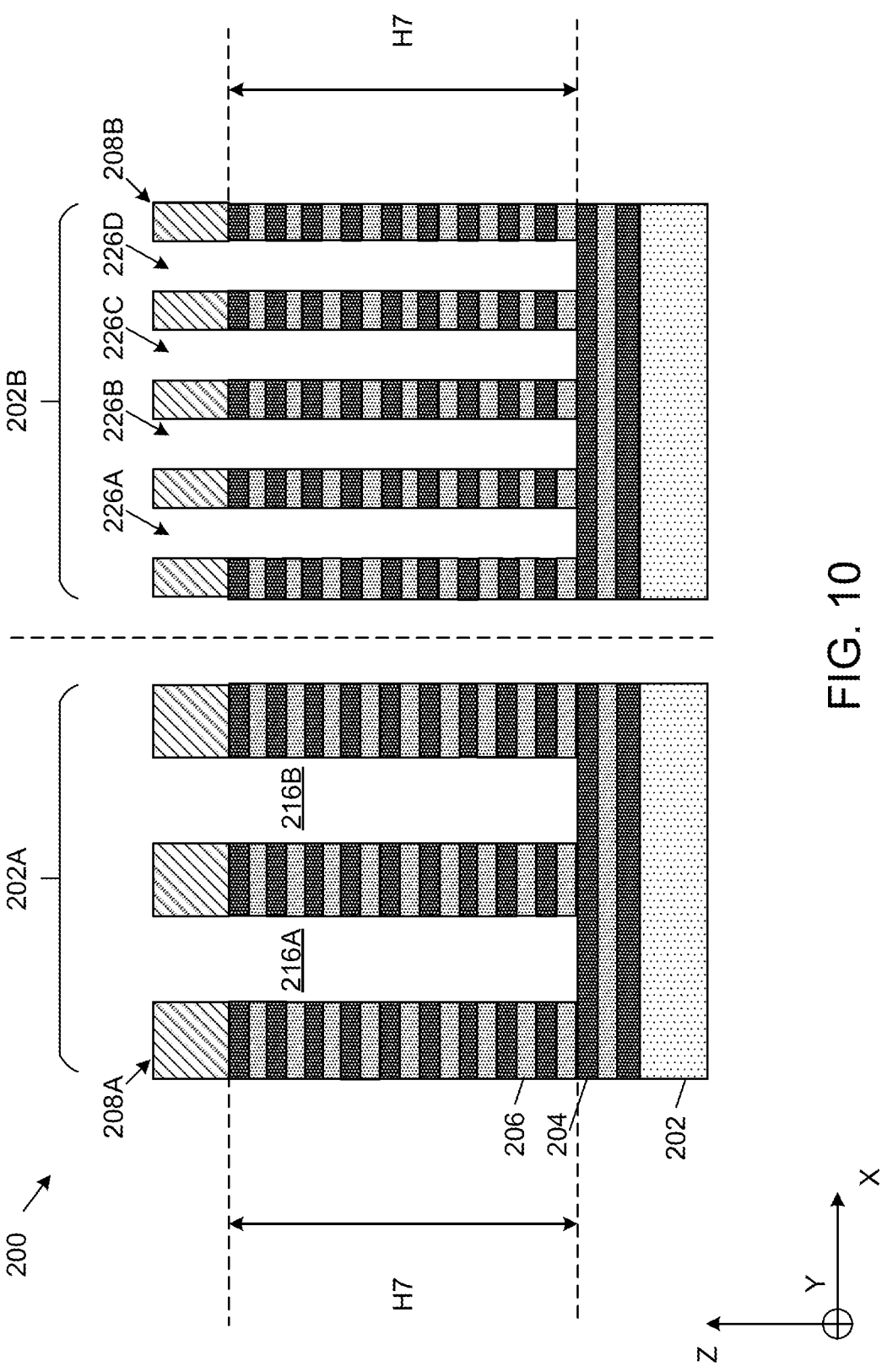

Referring to FIGS. 2A and 6D-6F, the method 120 at operation 128 repeats operations 122 to 126 until the depth of the first trenches 216A-216B and the depth of the second trenches 226A-226D are substantially uniform and at a predetermined magnitude, such as a depth H7 as shown in FIG. 10.

Figure 6C:
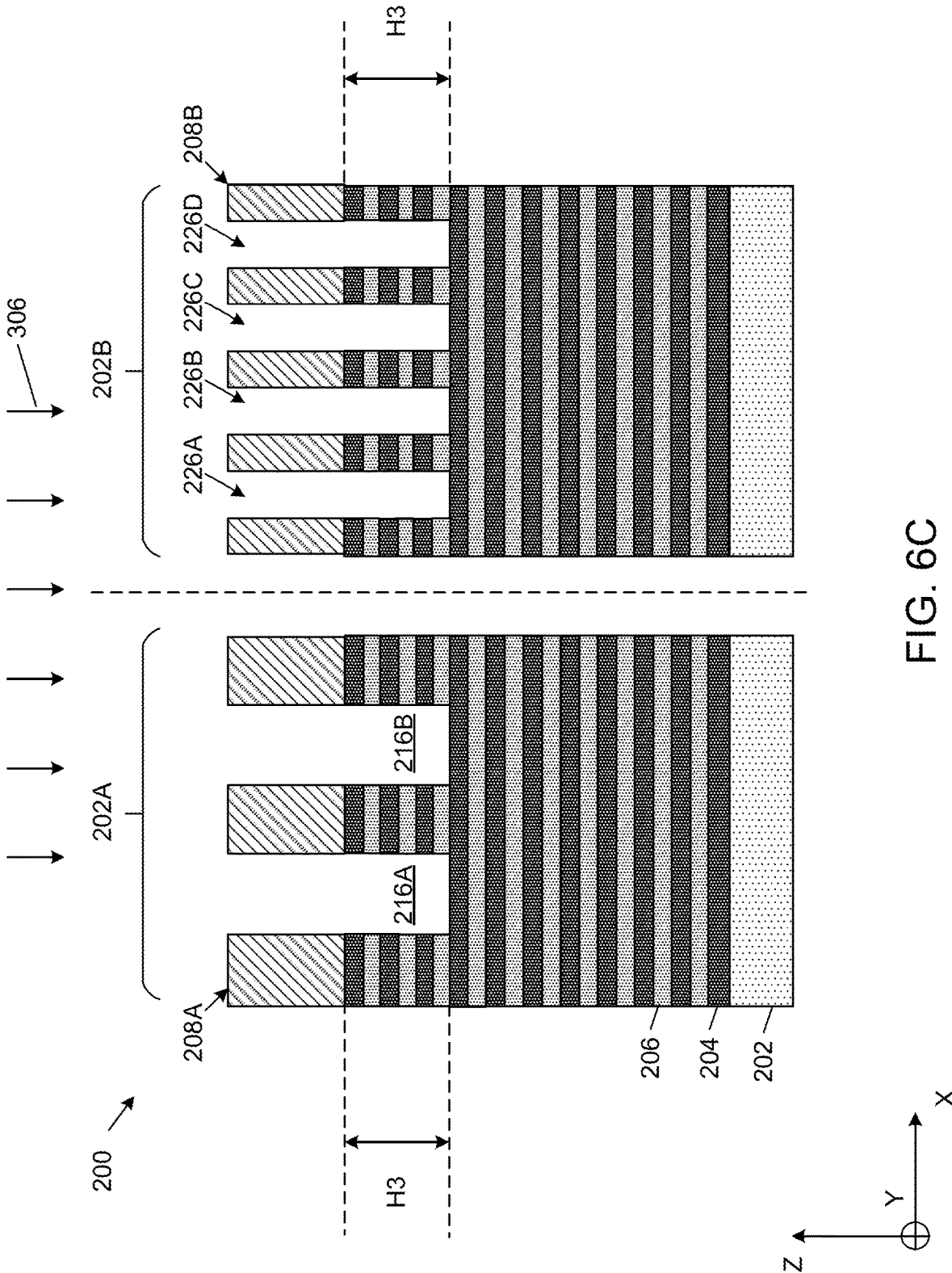
Figure 6D:
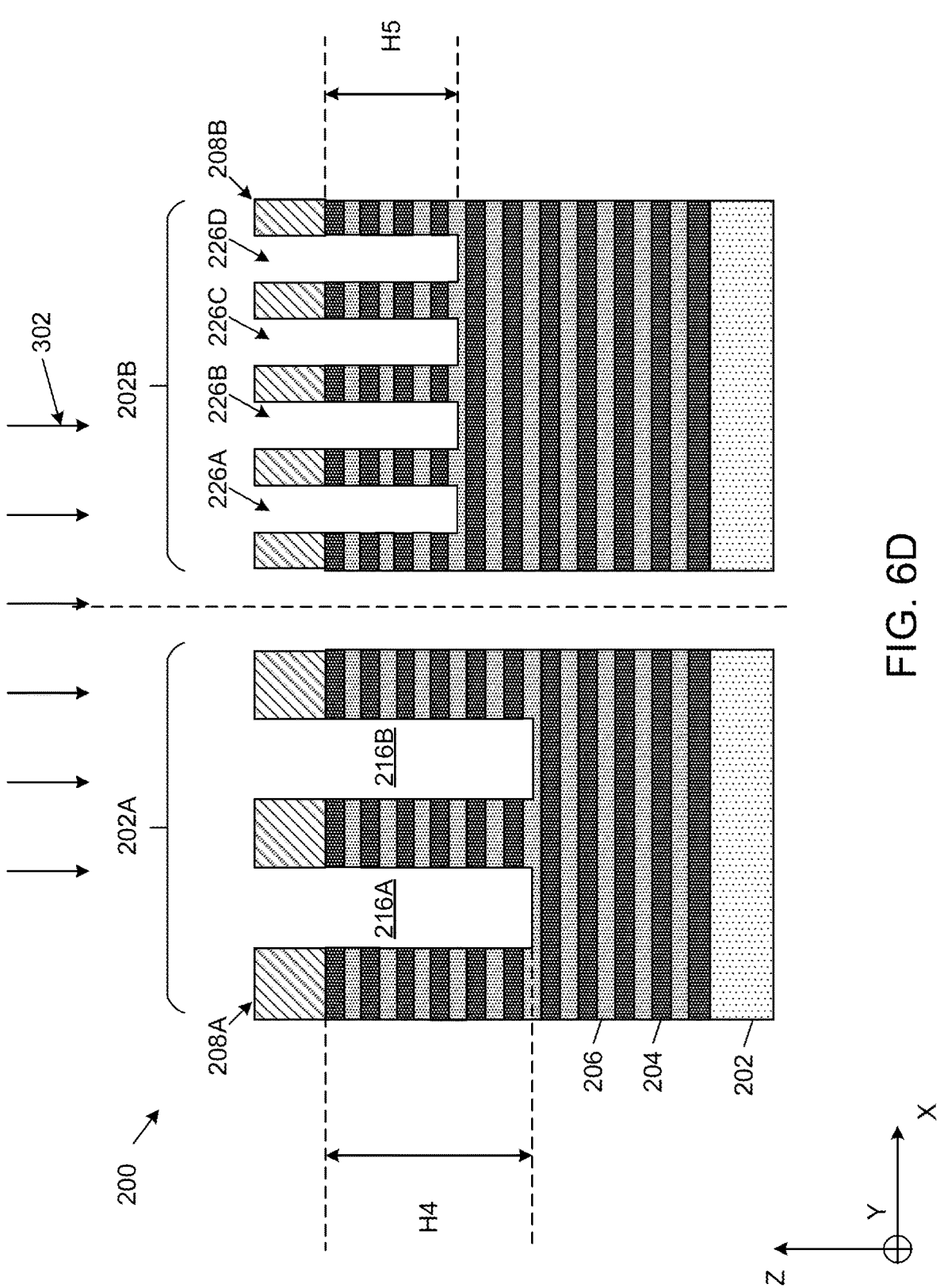
Figure 6E:
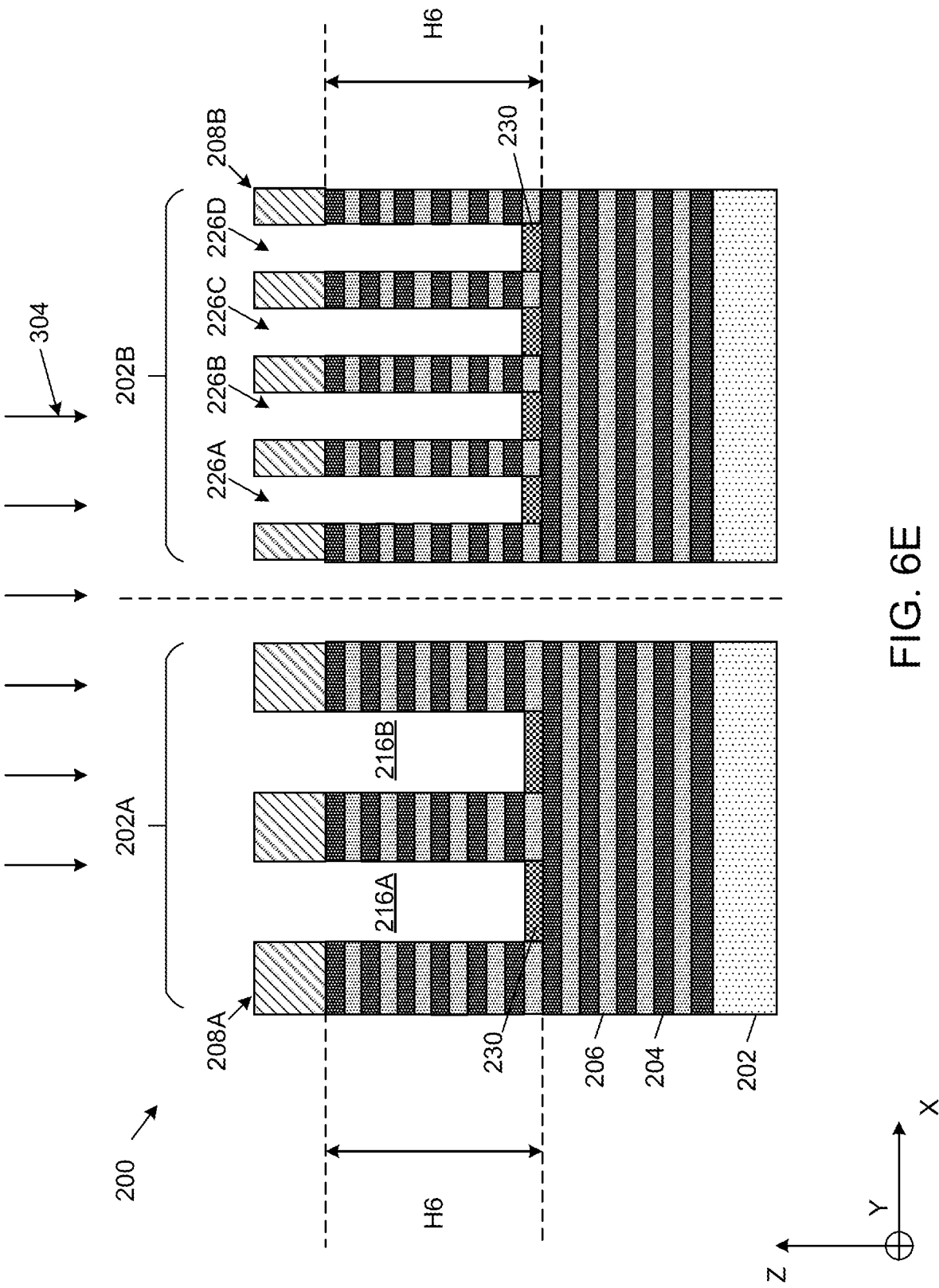
Figure 6F:
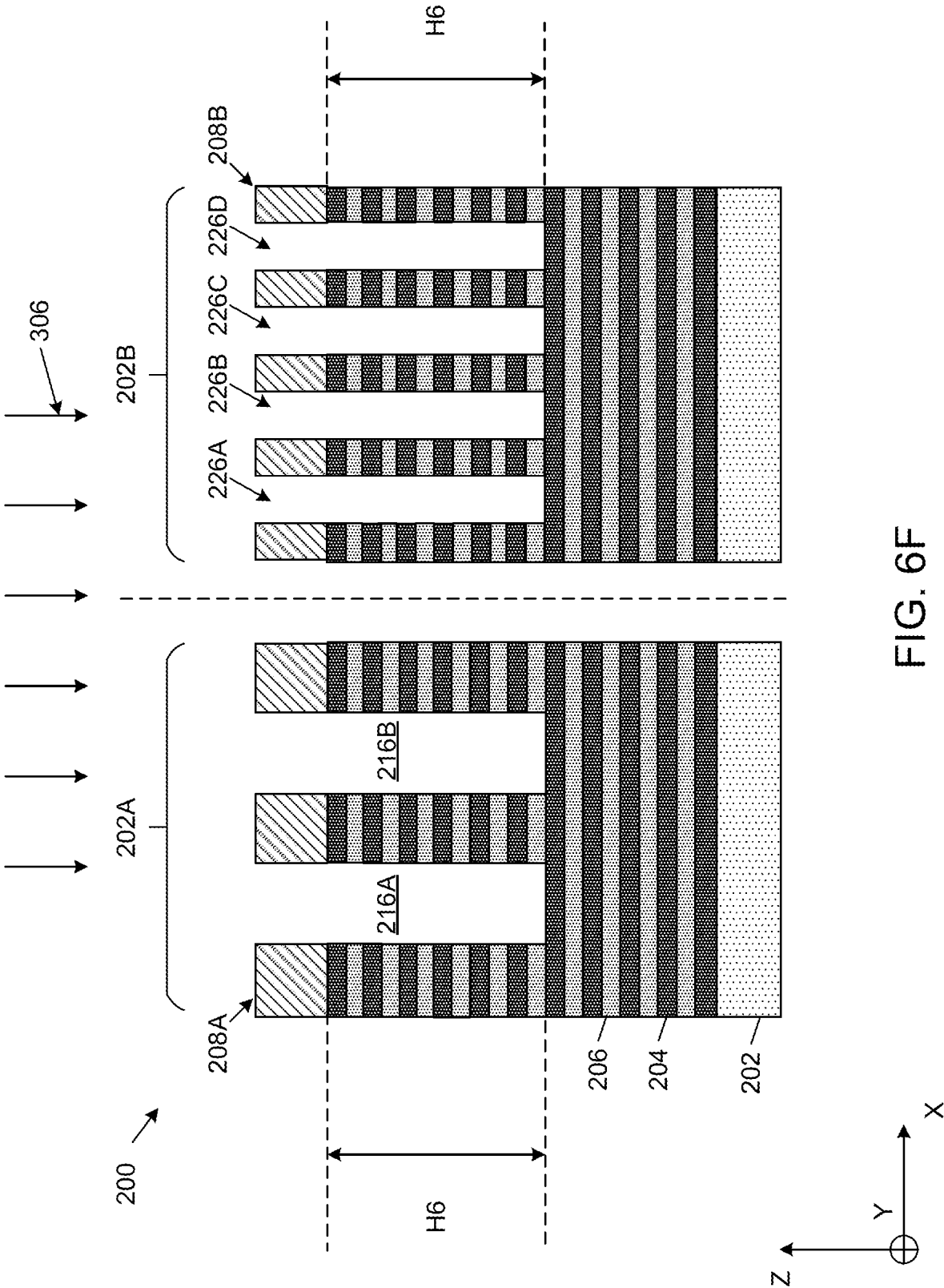

For example, referring to FIG. 6D, which corresponds to FIG. 6A, the first etching process 302 is repeated after removing the tungsten-containing nitride layer 230, thereby deepening the first trenches 216A-216B to a depth H4 and the second trenches 226A-226D to a depth H5 that is less than H4 but greater than the depth H3. Subsequently, referring to FIG. 6E, which corresponds to FIG. 6B, the second etching process 304 is performed to deepen the the first trenches 216A-216B and the second trenches 226A-226D to substantially the same depth H6, while forming the tungsten-containing nitride layer 230 as a byproduct over the bottom surfaces of the first trenches 216A-216B and the second trenches 226A-226D. Referring to FIG. 6F, which corresponds to FIG. 6C, the third etching process 306 is performed to remove the tungsten-containing nitride layer 230 from the first trenches 216A-216B and the second trenches 226A-226D. In some implementations, operations 122-126 may be repeated for multiple cycles until the pre-determined depth (e.g., depth H7 as shown in FIG. 10) is reached in the first trenches 216A-216B and the second trenches 226A-226D.

Figure 9A:
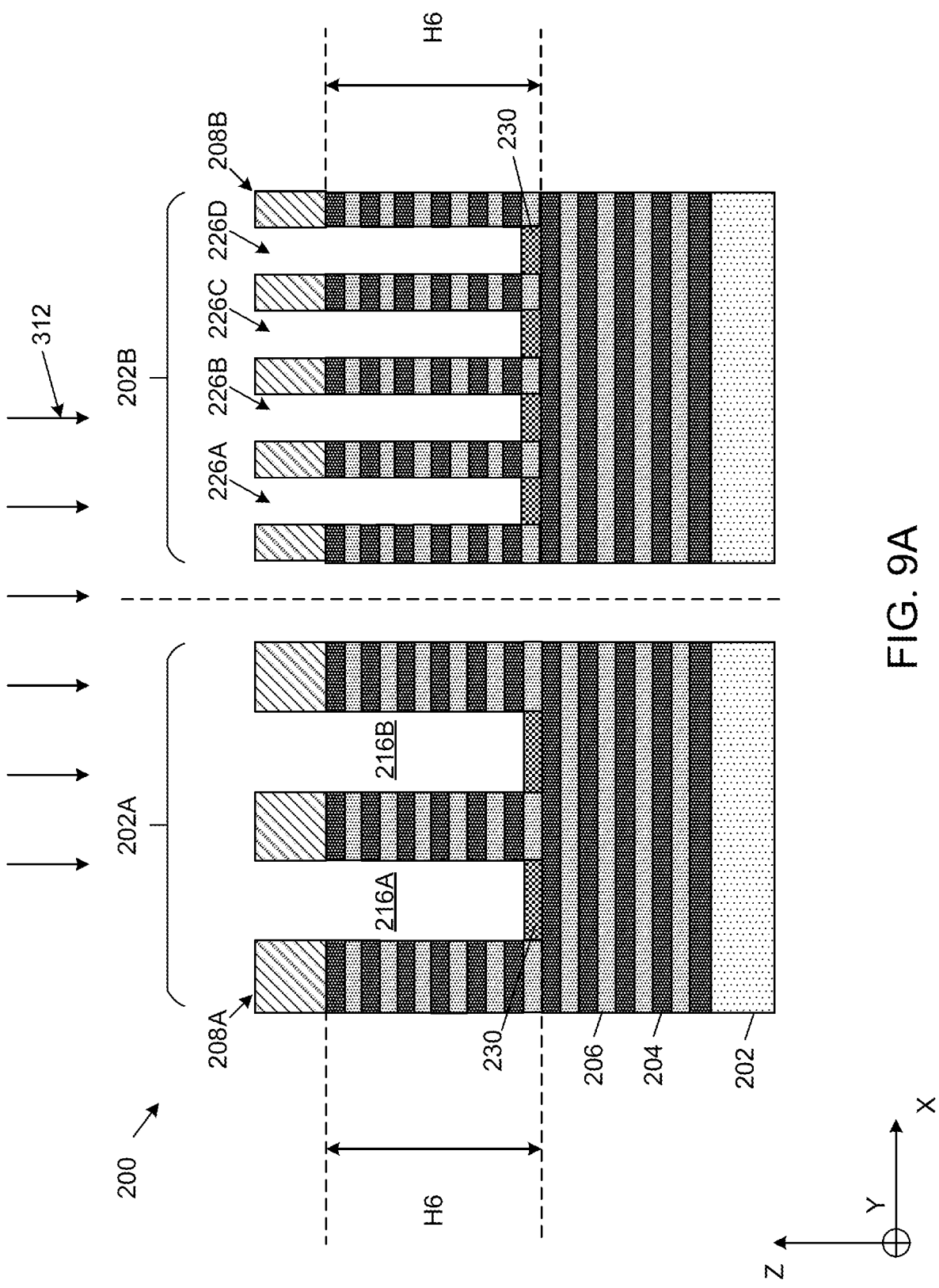
Figure 9B:
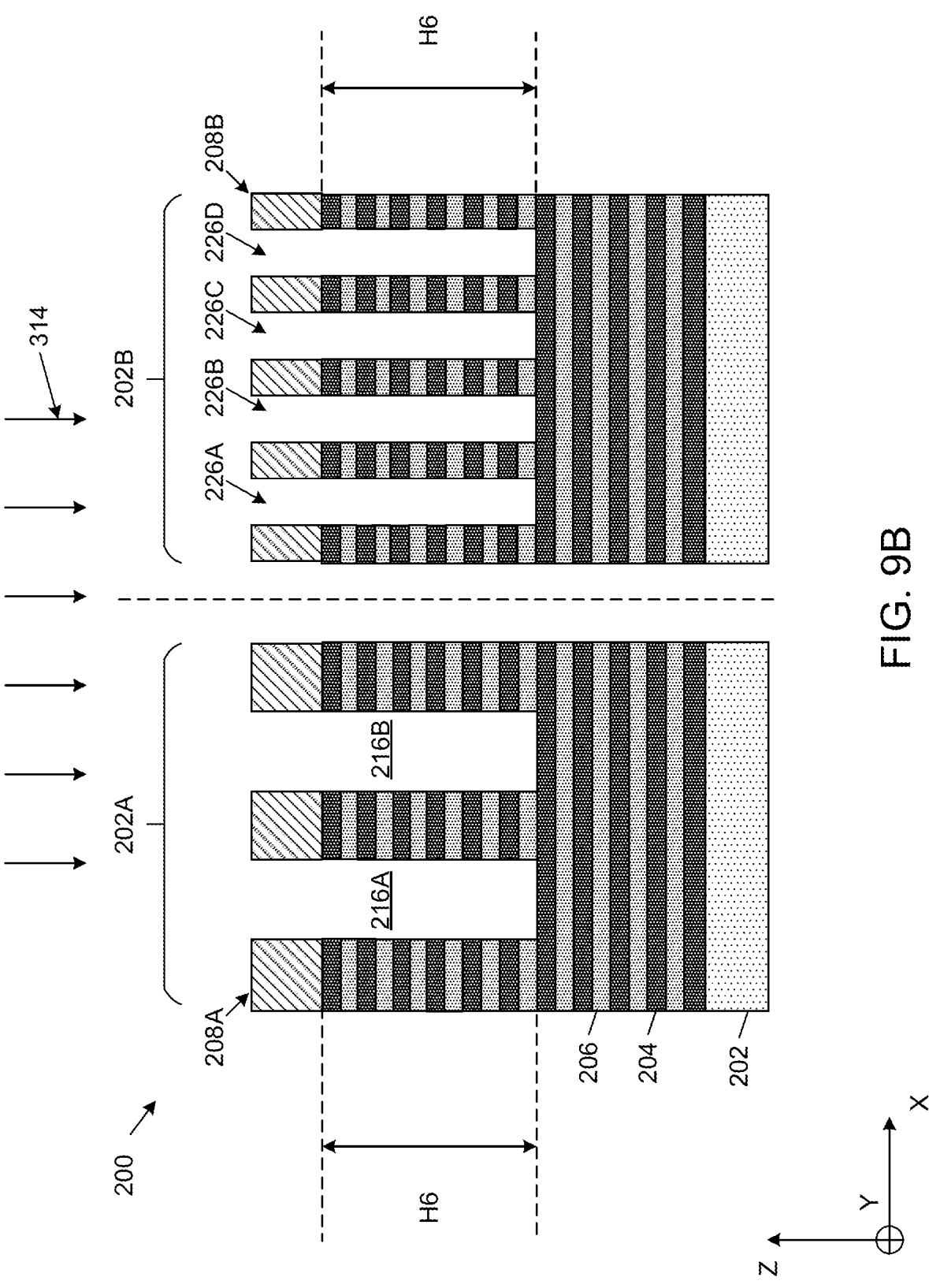

In some implementations, referring to FIGS. 9A and 9B collectively, the operation 108 may be implemented using the method 140 as depicted FIG. 2B, for example.

Referring to FIGS. 2B and 9A, the method 140 at operation 142 performs a first etching process 312 to form the first trenches 216A-216B using the first patterned mask 208A as the etch mask and second trenches 226A-226D using the second patterned mask 208B as the etch mask.

In the present implementations, the first etching process 312 may be implemented in a manner similar to the second etching process 304 at operation 124. For example, the first etching process 312 may be an RIE process implemented using a chemically reactive plasma that includes a first etchant and a second etchant different from the first etchant. In the present implementations, the first etchant may include a fluorine-containing etchant provided herein, oxygen, the like, or combinations thereof, and the second etchant includes a tungsten-containing etchant, such as $WF_6$. As described in detail above, the first etchant is configured to remove both the dielectric layers 204 and 206 and the second etchant is configured to selectively react with a nitride material of the dielectric layer 204 to form the tungsten-containing nitride layer 230 in the first trenches 216A-216B and the second trenches 226A-226D.

However, different from the second etching process 304, the first etching process 312 at operation 142 is implemented using the second etchant (e.g., $WF_6$) applied at, or substantially at, the critical flow rate $GR_C$, which is shown in the schematic plot 400 of FIG. 7. For example, the first etching process 312 may be implemented using the second etchant applied at a flow rate within about ±5% of the $GR_C$. As the $GR_C$ corresponds to the crossover point 420 of multiple datasets each describing changes in the effective etching rate as a function of the flow rate of the tungsten-containing etchant in a trench of a given dimension, implementing the first etching process 312 at the $GR_C$ provides the etching condition at which the effective etching rates in trenches of different dimensions (e.g., CD1 and CD2) are substantially the same. In this regard, instead of cycling through the first etching process 302 implemented in the RIE regime 422 and the second etching process 304 implemented in the i-RIE regime 424, the first etching process 312 is implemented at a fixed flow rate between the two regimes, such that the effective etching rates in the first trenches 216A-216B and the second trenches 226A-226D are tuned to be the same, or substantially the same, resulting in the same, or substantially the same, depths (e.g., the depth H7 as shown in FIG. 10) in the trenches.

Subsequently, referring to FIGS. 2B and 9B, the method 140 at operation 144 removes the tungsten-containing nitride layer 230 from the first trenches 216A-216B and the second trenches 226A-226D in a second etching process 314.

In the present implementations, the second etching process 314 may be implemented in a manner similar to the third etching process 316 at operation 126. For example, the second etching process 314 may be implemented using an etchant including a noble gas, such as Ar, Kr, the like, or combinations thereof. In some examples, the third etching process 306 may be implemented using an etchant including a fluorine-containing etchant, such as $NF_3$.

In some implementations, the second etching process 314 is applied after implementing the first etching process 312. i.e., after completing the formation of the first trenches 216A-216B and the second trenches 226A-226D. In some examples, the first etching process 312 may be applied to form the first trenches 216A-216B and the second trenches 226A-226D to a desired depth, such as the depth H7, is achieved (see FIG. 10), followed by applying the second etching process 314 to remove the tungsten-containing nitride layer 230. In some examples, the first trenches 216A-216B and the second trenches 226A-226D may be deepened by alternating the first etching process 312 and the second etching process 314 until the desired depth, such as the depth H7, is achieved.

Figure 11:
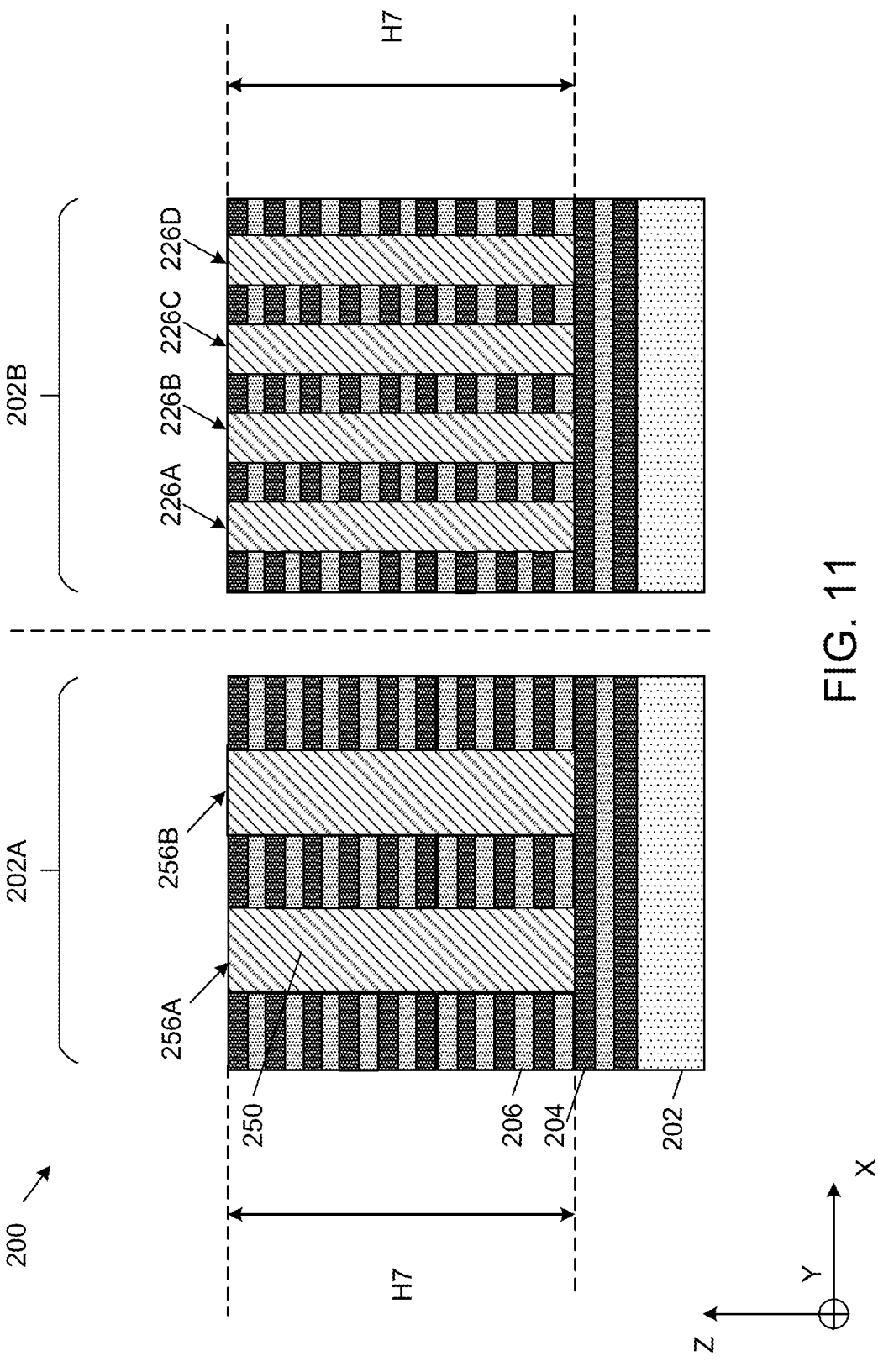

Referring to FIGS. 1, 10, and 11, after completing the formation of the first trenches 216A-216B and the second trenches 226A-226D according to the method 120 or the method 140, the method 100 at operation 110 proceeds to forming first conductive features 256A and 256B in the first trenches 216A and 216B, respectively, and second conductive features 266A, 266B, 266C, and 266D in the second trenches 226A-226D, respectively.

Referring to FIG. 11, forming the conductive features 256A-256B and 266A-266D includes depositing a conductive layer over the semiconductor structure 200 to fill the first trenches 216A-216B and the second trenches 226A-226D. The conductive layer may include any suitable material, such as Cu, W, Ni, Al, Ru, Ag, Au, Pt, Ti, Ta, TiN, TaN, the like, or combinations thereof. The conductive layer may be deposited using any suitable deposition technique, such as CVD, PVD, ALD, electroplating, electroless plating, the like, or combinations thereof. Though not depicted, additional material layers, such as a barrier layer and/or a seed layer, may be formed in the first trenches 216A-216B and the second trenches 226A-226D before depositing the conductive layer. A chemical-mechanical polishing/planarization (CMP) process may be implemented after the deposition process to remove any excess portions of the conductive layer formed over a top surface of the stack 207, thereby forming the first conductive features 256A-256B and the second conductive features 266A-266D.

In some implementations, referring to FIGS. 1 and 12A-14C collectively, the effective etching rate of the stack 207 in the first trenches 216A-216B and the second trenches 226A-226D, respectively, may be tuned by using an alternative material for the etch masks.

For example, referring to FIGS. 12A-12D, which depict operations 102-110 of the method 100 of FIG. 1, the semiconductor structure 200 is processed using a first patterned mask 212A and a second patterned mask 212B over the first region 202A and the second region 202B, respectively.

Figure 12A:
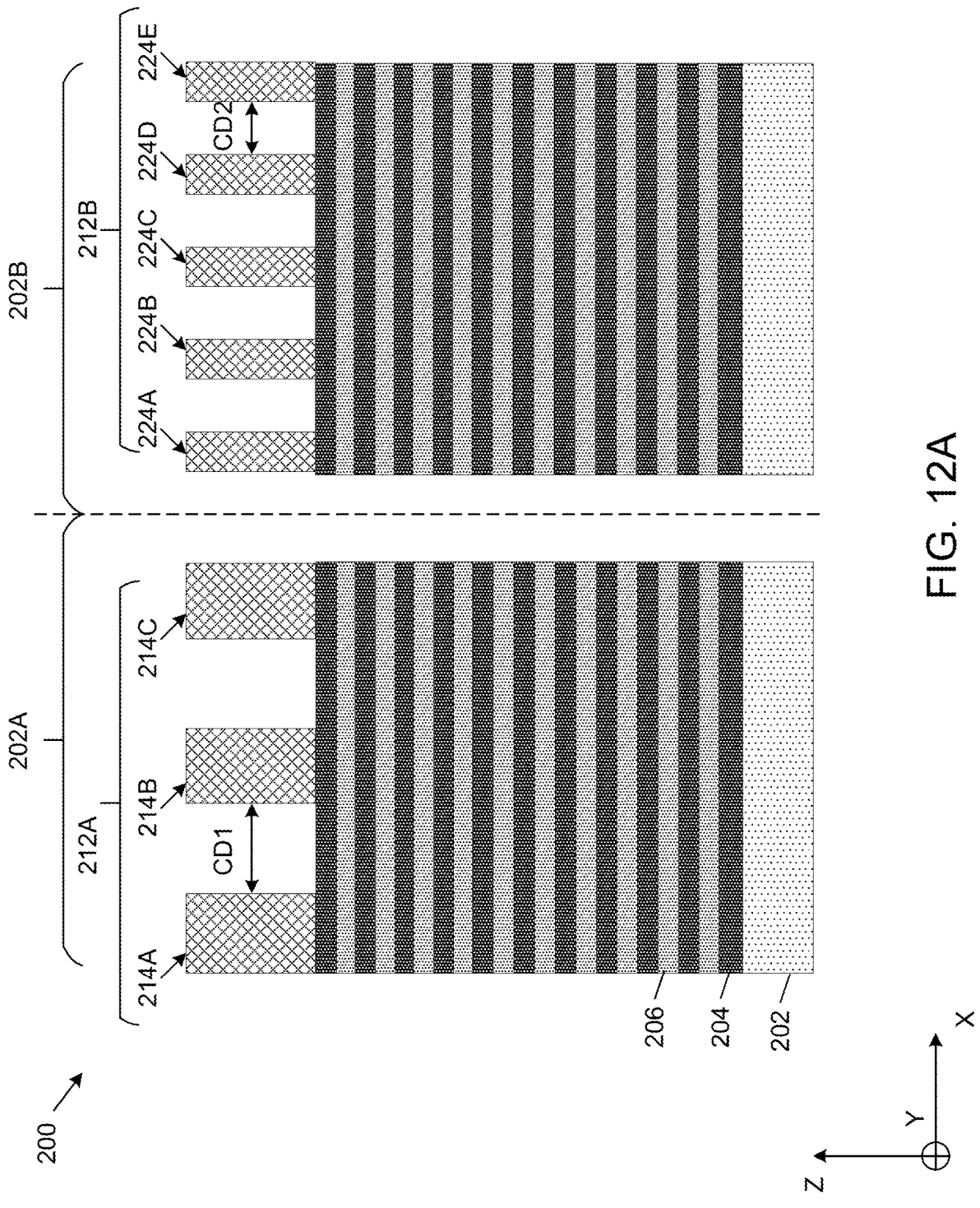

Referring to FIGS. 1 and 12A, after forming the stack 207 over the substrate 202 at operations 102-104, the method 100 at operation 106 forms the the first patterned mask 212A and the second patterned mask 212B. As shown, the first patterned mask 212A includes patterns 214A, 214B, and 214C, which are similar to the patterns 210A-210C of the first patterned mask 208A, and the second patterned mask 212B includes patterns 224A, 224B, 224C, and 224D, which are similar to the patterns 220A-220D of the second patterned mask 208B.

The first patterned mask 212A and the second patterned mask 212B may be formed at operation 106 by a series of processes similar to those for forming the first patterned mask 208A and the second patterned mask 208B described herein. However, different from the first patterned mask 208A and the second patterned mask 208B, the first patterned mask 212A and the second patterned mask 212B each include a tungsten-containing material, such as tungsten silicide (WSi), tungsten silicon nitride (WSiN), or both, rather than ACL, which is included in the first patterned mask 208A and the second patterned mask 208B. For this reason, the first patterned mask 212A and the second patterned mask 212B may each be alternatively referred to as a patterned tungsten-containing hard mask. In some implementations, the first patterned mask 212A and the second patterned mask 212B may be formed as two separated patterned masks. Alternatively, the first patterned mask 212A and the second patterned mask 212B may be formed as two portions of a single continuous patterned mask.

In some implementations, tungsten-containing hard masks may be deposited over the stack 207 using any suitable deposition technique, such as PVD, CVD, ALD, the like, or combinations thereof, and subsequently patterned using any suitable technique described herein to form the first patterned mask 212A and the second patterned mask 212B.

Figure 12B:
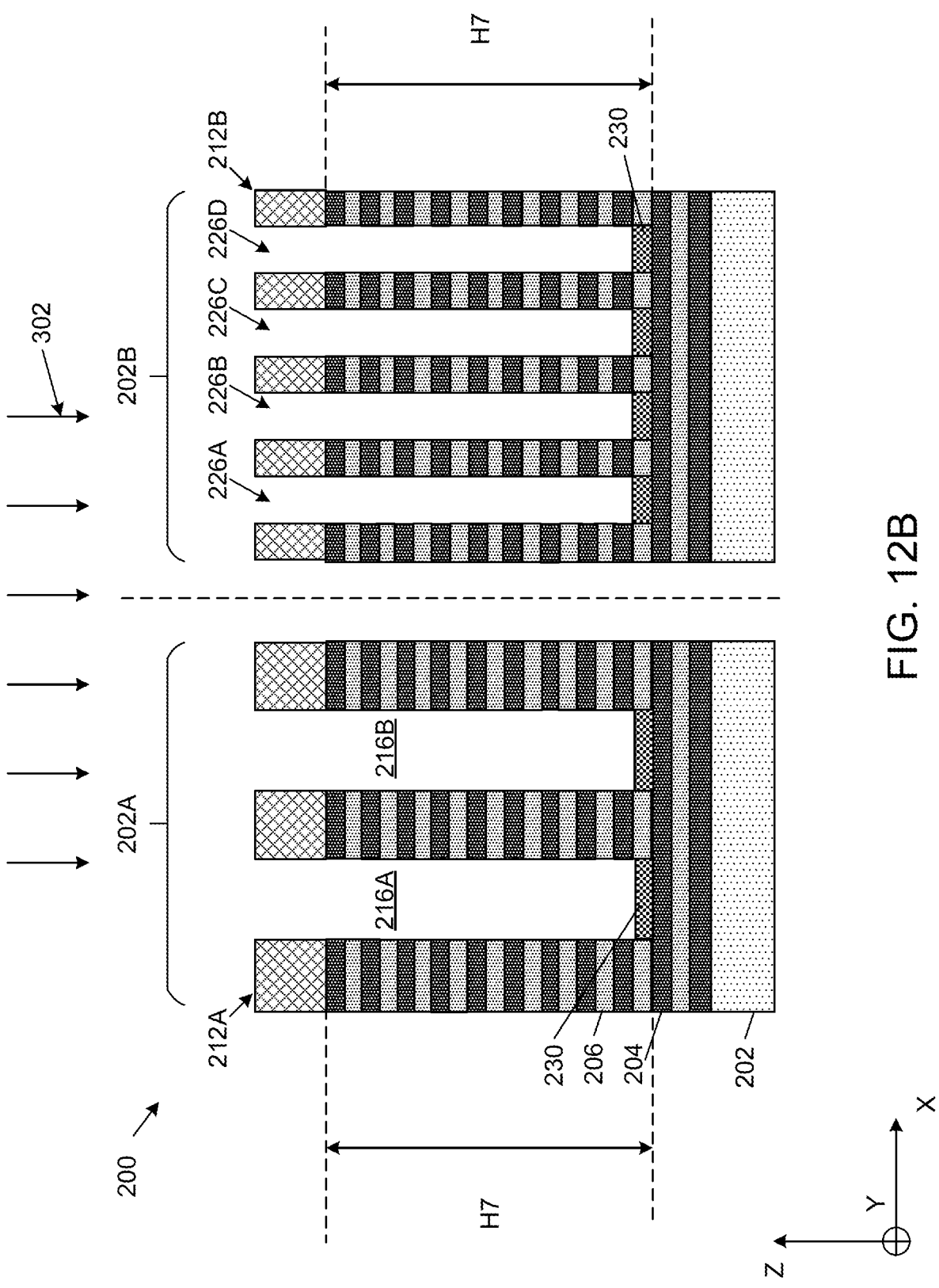
Figure 12C:
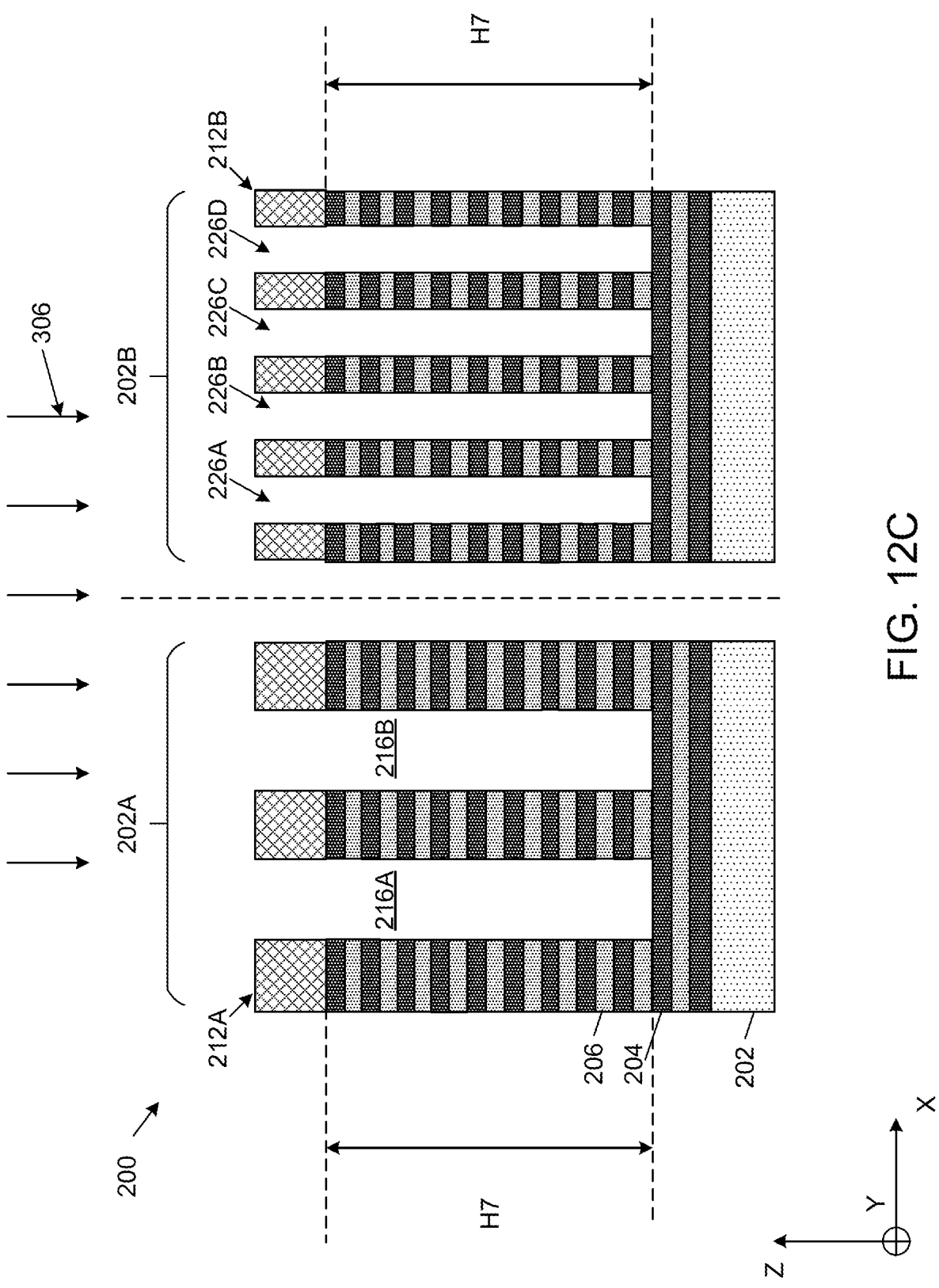

Referring to FIGS. 1, 12B, and 12C, the method 100 at operation 108 performs the first etching process 302 to pattern the stack 207 using the first patterned mask 212A and the second patterned mask 212B as etch masks, thereby forming the first trenches 216A-216B and the second trenches 226A-226D, respectively.

Conditions of the first etching process 302 have been described in detail above. For example, the first etching process 302 may be performed as an RIE process using a plasma including a fluorine-containing etchant provided herein, oxygen, the like, or combinations thereof. In addition, the plasma may include nitrogen. In the present implementations, WSi in the first patterned mask 212A and the second patterned mask 212B reacts with the nitride material in the dielectric layer 204 (and/or the nitrogen included in the plasma) to form the tungsten-containing nitride layer 230 in the first trenches 216A-216B and the second trenches 226A-226D, respectively. In some implementations, the plasma used by the first etching process 302 includes the tungsten-containing etchant applied at a flow rate below the flow rate $GR_C$ as shown in FIG. 7. In some implementations, the plasma used by the first etching process 302 is free, or substantially free, of any tungsten-containing etchant (e.g., $WF_6$). In other words, the flow rate of the tungsten-containing etchant may be approximately zero. Alternatively, the plasma used by the first etching process 302 includes the tungsten-containing etchant applied at a flow rate above the flow rate $GR_C$ as shown in FIG. 7.

In the present implementations, referring to FIG. 12B, the inclusion of tungsten (in the form of WSi, WSiN, or both) in the first patterned mask 212A and the second patterned mask 212B reduces the effective etching rate ER1' of the stack 207 (e.g., the dielectric layer 204) in the first trenches 216A-216B to a level the same, or substantially the same, as the effective etching rate ER2' of the stack 207 in the second trenches 226A-226D, thereby achieving substantially the same depth H7 in the first trenches 216A-216B and the second trenches 226A-226D, similar to the implementation depicted in FIG. 10.

Referring to FIG. 7 and similar to the effect of increasing the flow rate of $WF_6$, increasing the amount (e.g., concentration) of tungsten in the first patterned mask 212A and the second patterned mask 212B increases the amount of the tungsten-containing nitride layer 230 formed during the first etching process 312, thereby lowering the effective etching rate ER1' of the stack 207 in the first trenches 216A-216B, which are defined by the CD1. In this regard, the etching of the first trenches 216A-216B and the second trenches 226A-226D can be controlled by tuning the amount of tungsten in the first patterned mask 212A and the second patterned mask 212B. For example, by increasing the amount of tungsten in the first patterned mask 212A and the second patterned mask 212B to above a critical amount $GR_A$, which is analogous to the critical flow rate $GR_C$ as shown in FIG. 7, the effective etching rate ER1' in the first trenches 216A-216B is reduced as it transitions from the RIE regime 422 into the i-RIE regime 424. In some examples, the $GR_A$ may be no less than about 10% and no greater than about 90%, depending on the etching recipes employed (e.g., about 60% by weight). In this regard, tuning the concentration of tungsten included in the first patterned mask 212A and the second patterned mask 212B to about the $GR_A$ (e.g., within about ±5% by weight) ensures that the effective etching rate ER1' is the same, or substantially the same, as the effective etching rate ER2'.

Alternatively or additionally, increasing sputtering yield of WSi, WSiN, or both (e.g., by increasing ion flux and/or energy of the sputtering process) while using PVD to deposit the first patterned mask 212A and the second patterned mask 212B at operation 106 may also lower the effective etching rate ER1' in the first trenches 216A-216B.

Referring to FIG. 12C, the method 100 at operation 108 subsequently removes the tungsten-containing nitride layer 320 from the first trenches 216A-216B and the second trenches 226A-226D using the third etching process 306 described in detail above.

Figure 12D:
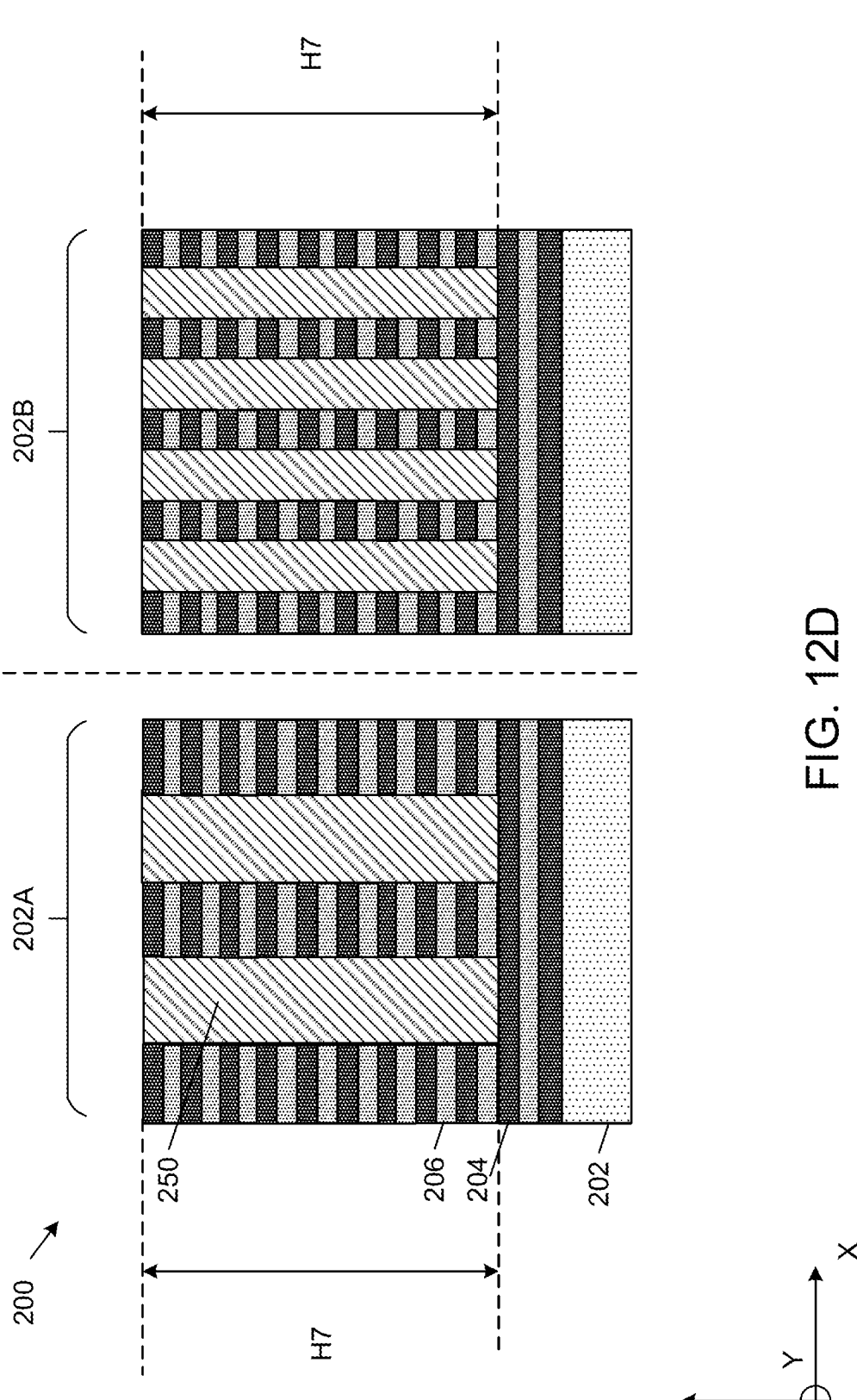

Subsequently, referring to FIGS. 1 and 12D, the method 100 at operation 110 forms the first conductive features 256A-256B in the first trenches 216A-216B and the second conductive features 266A-266D in the second trenches 226A-226D, respectively, similar to the implementation depicted in FIG. 11.

In some implementations, referring to FIGS. 13A, 13B, 13C, and 13D collectively, the first patterned mask 212A and the second patterned mask 212B may be applied to operations of the method 120.

Figure 13A:
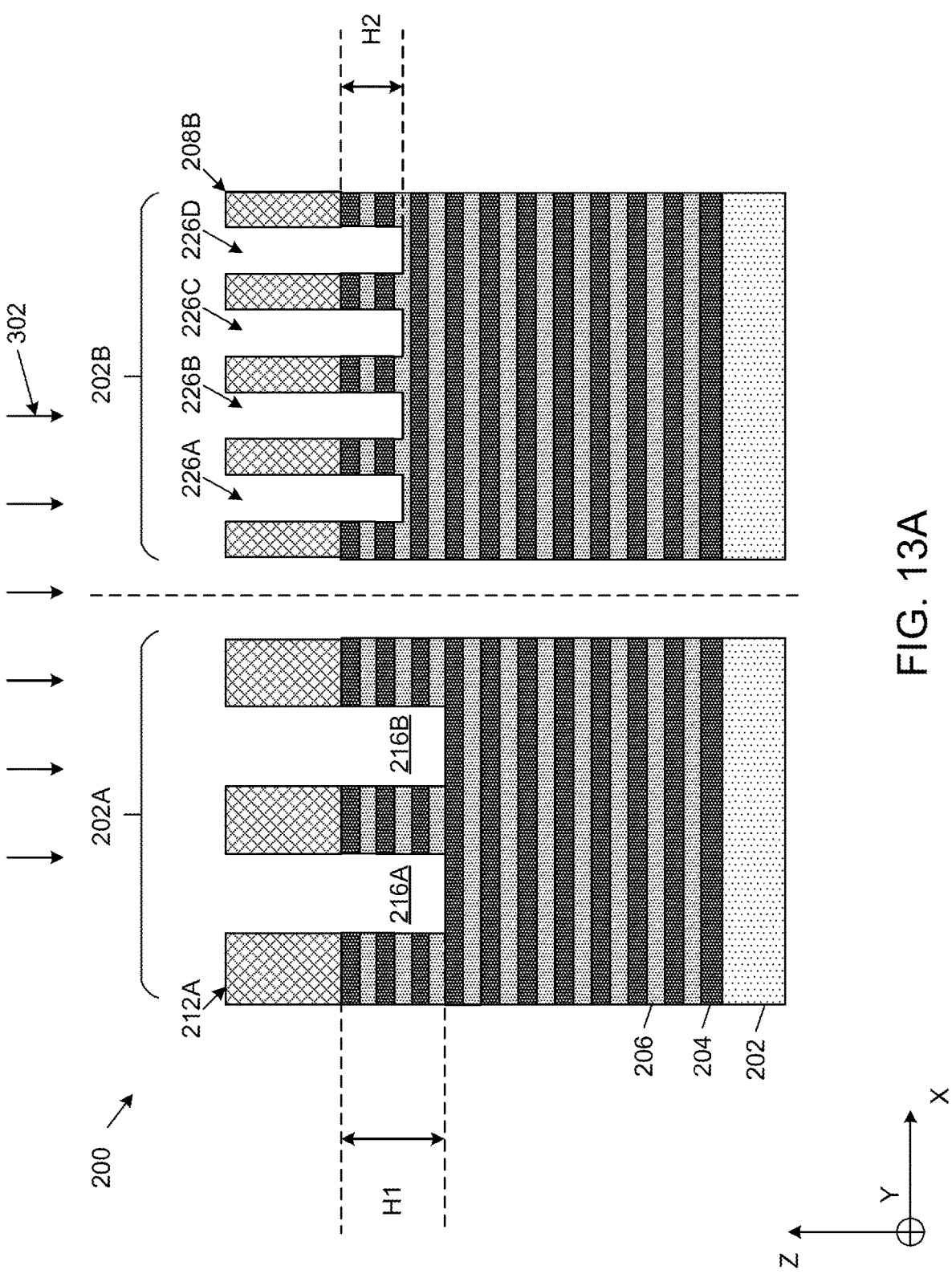

For example, referring to FIGS. 2A and 13A, which corresponds to FIG. 6A, the method 120 at operation 122 performs the first etching process 302 to form the first trenches 216A-216B using the first patterned mask 212A as an etch mask and the second trenches 226A-226D using the second patterned mask 212B as an etch mask, where the first trenches 216A-216B and the second trenches 226A-226D are formed to different depths, H1 and H2, respectively. In other words, the first trenches 216A-216B and the second trenches 226A-226D are formed with the tungsten-containing etchant (e.g., WF$_6$) applied at a flow rate below the GR$_C$ within the RIE regime 422 according to FIG. 7.

Figure 13B:
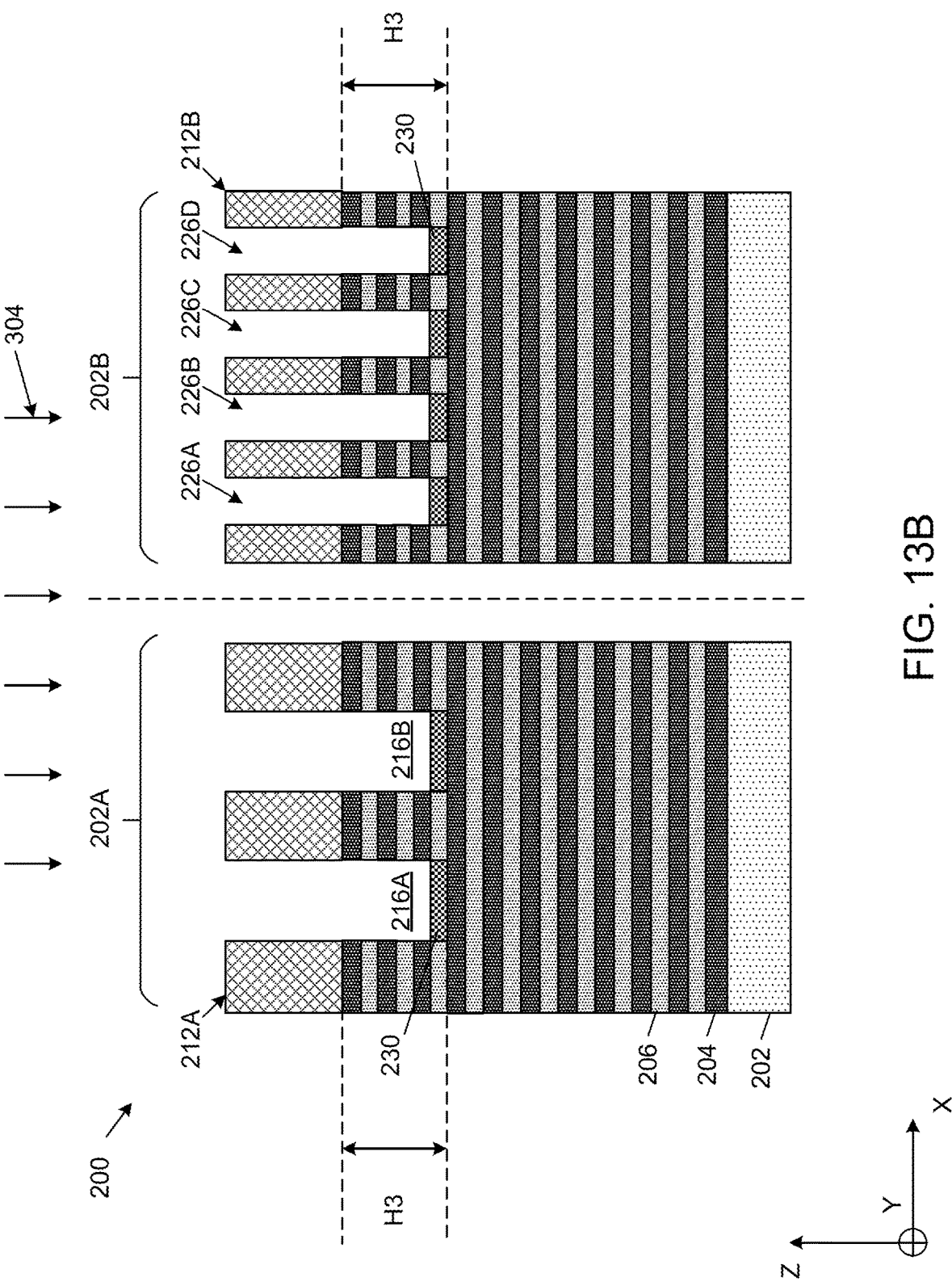

Referring to FIGS. 2A and 13B, which corresponds to FIG. 6B, the method 120 at operation 124 performs the second etching process 304 to deepen the first trenches 216A-216B and the second trenches 226A-226D to the same depth H3, resulting in the tungsten-containing nitride layer 230 formed in the first trenches 216A-216B and the second trenches 226A-226D. In other words, the first trenches 216A-216B and the second trenches 226A-226D are formed with the tungsten-containing etchant (e.g., WF$_6$) applied at a flow rate above the GR$_C$ within the i-RIE regime 422 according to FIG. 7.

Figure 13C:
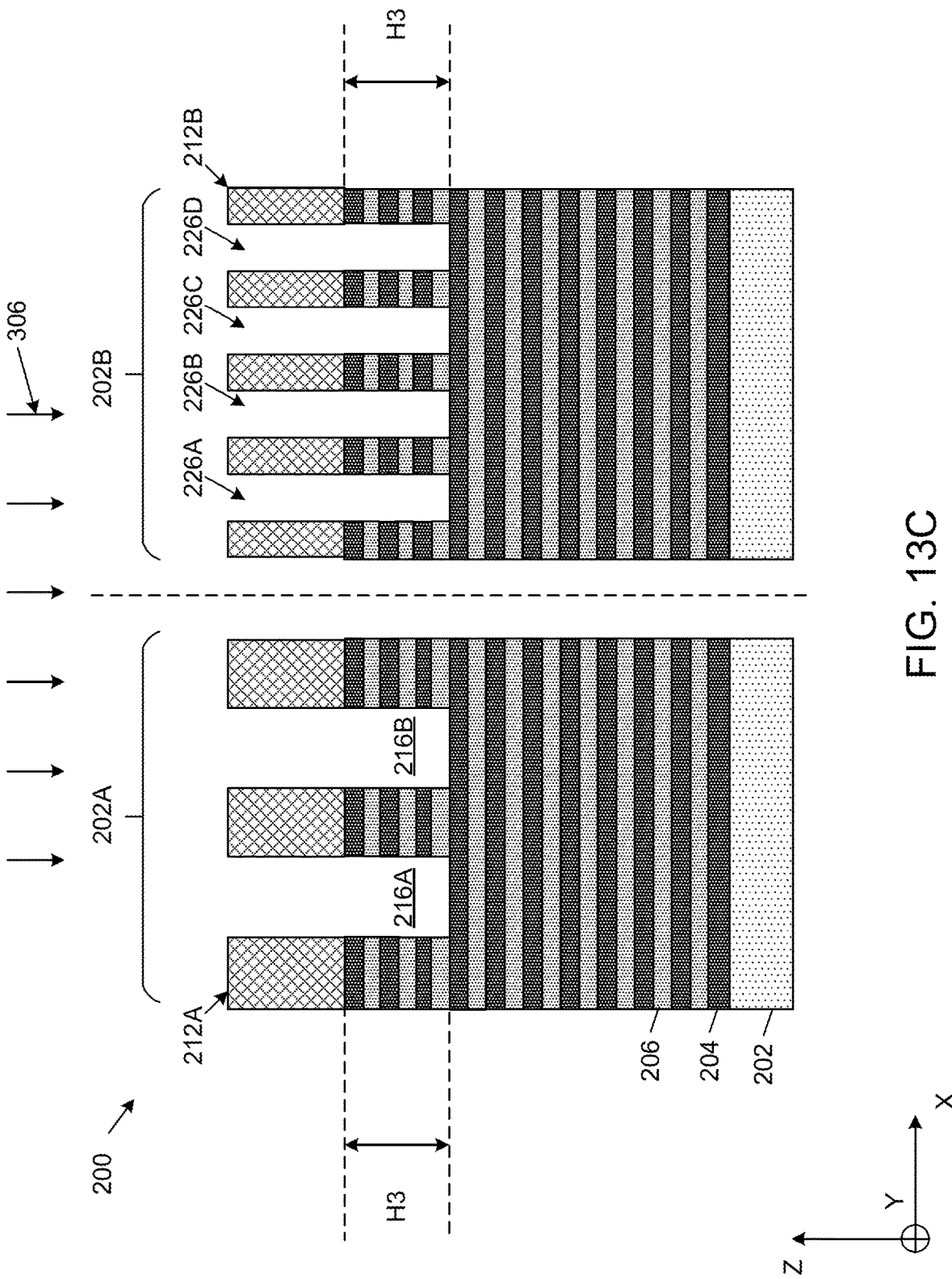

Referring to FIGS. 2A and 13C, which corresponds to FIG. 6C, the method 120 at operation 126 performs the third etching process 306 to remove the tungsten-containing nitride layer 230.

Figure 13D:
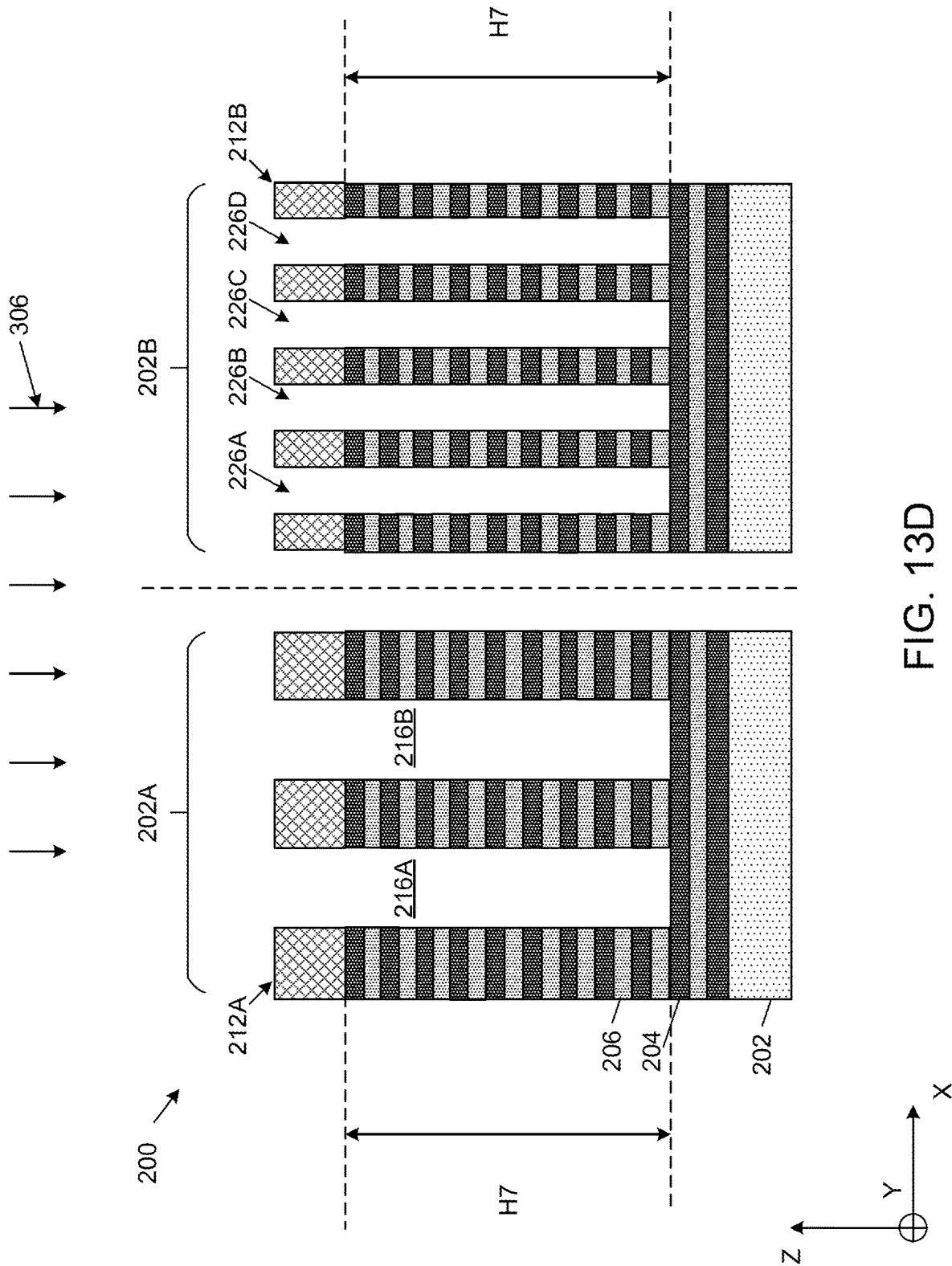

Referring to FIGS. 2A and 13D, which corresponds to FIGS. 6D-6F and 10 collectively, the method 120 at operation 128 repeats operations 122 to 126 until the depth of the first trenches 216A-216B and the depth of the second trenches 226A-226D are substantially the same and at a predetermined magnitude, such as the depth H7 as shown in FIG. 13D.

Figure 14A:
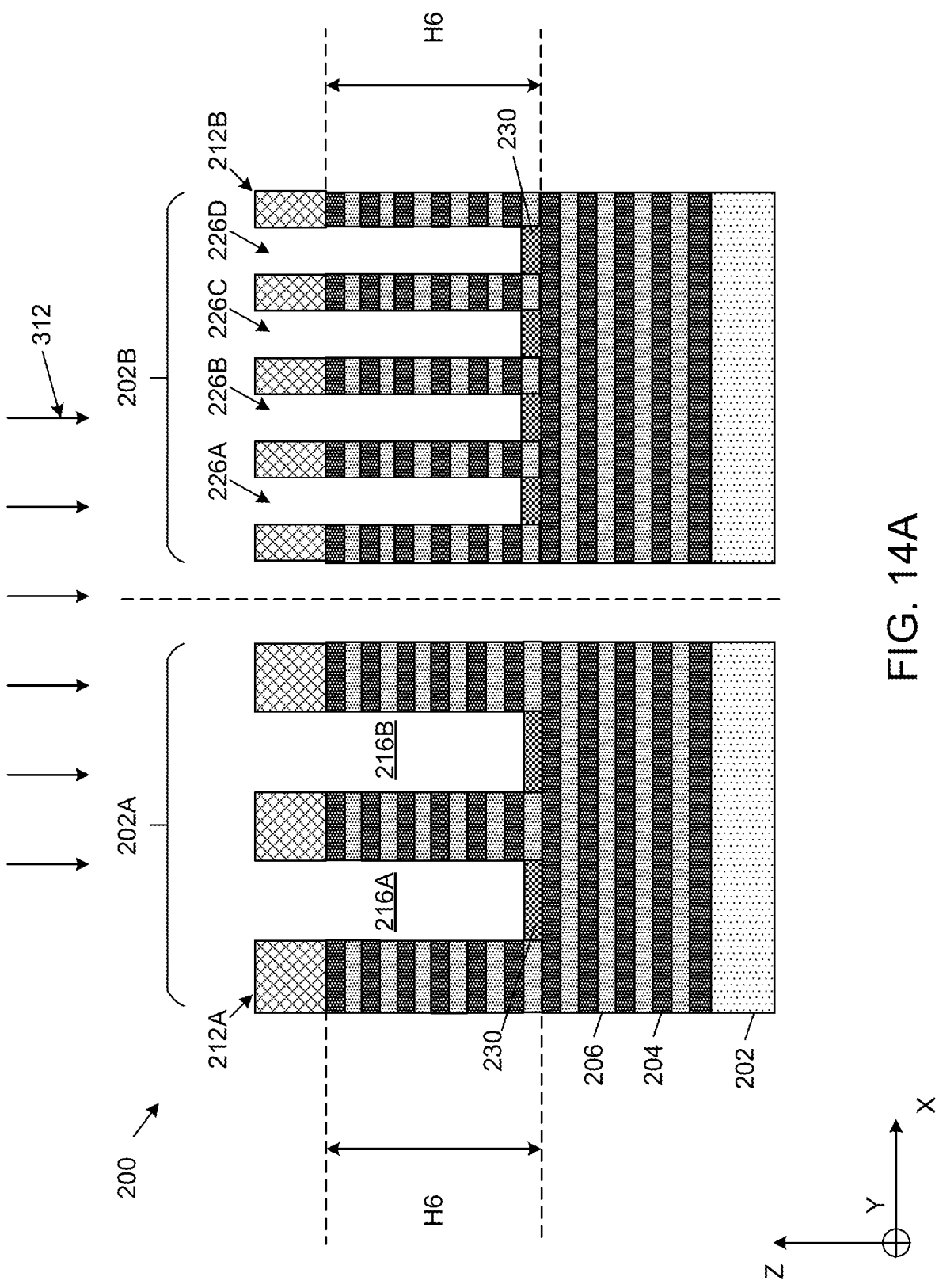
Figure 14B:
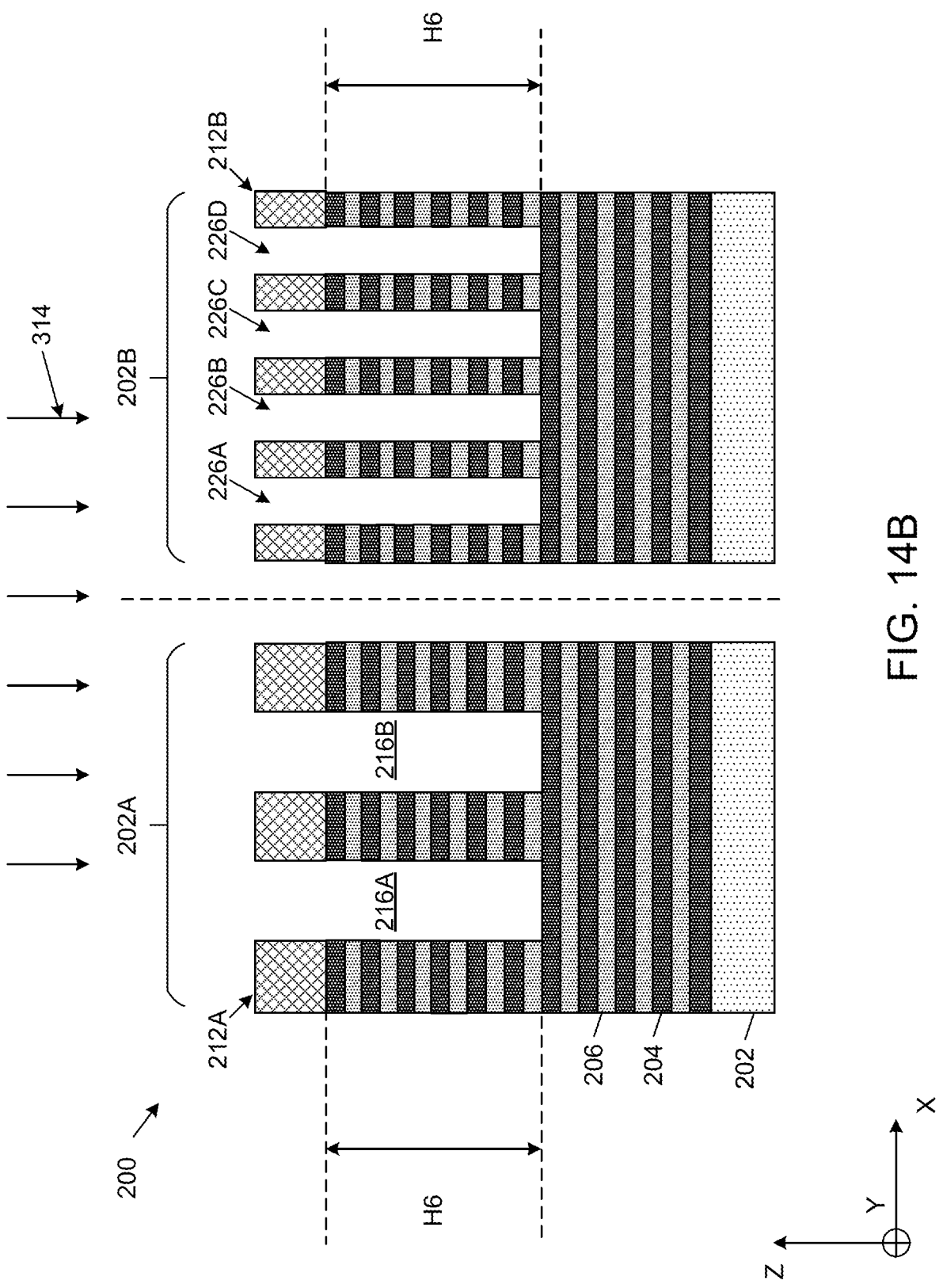
Figure 14C:
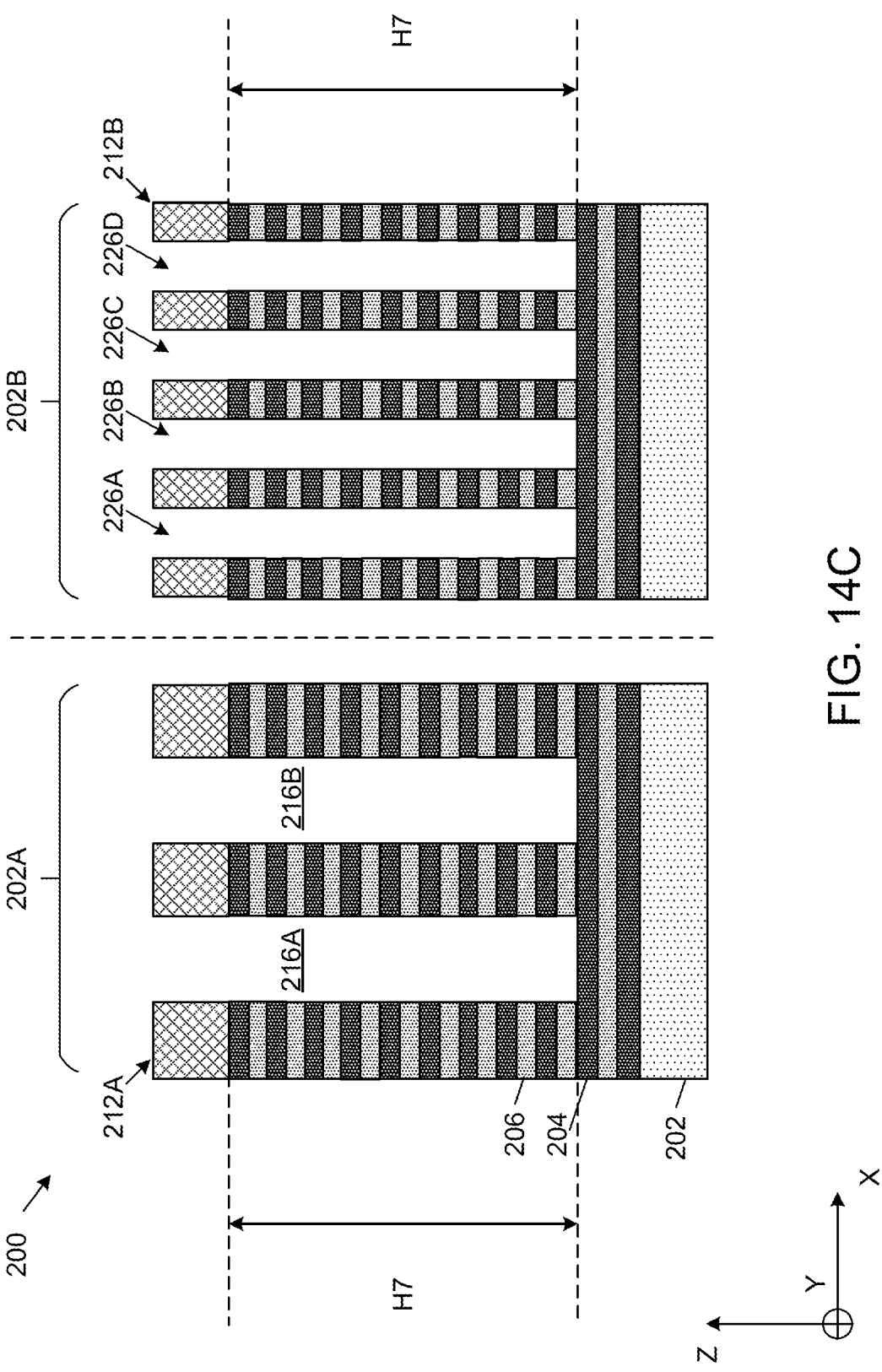

In some implementations, referring to FIGS. 14A, 14B, and 14C collectively, the first patterned mask 212A and the second patterned mask 212B may be applied to operations of the method 140.

For example, referring to FIGS. 2A and 14A, which corresponds to FIG. 9A, the method 140 at operation 142 performs the first etching process 312 to form form the first trenches 216A-216B using the first patterned mask 212A as an etch mask and second trenches 226A-226D using the second patterned mask 212B as an etch mask, where the first trenches 216A-216B and the second trenches 226A-226D are formed to substantially the same depth H6. In other words, the first trenches 216A-216B and the second trenches 226A-226D are formed with the tungsten-containing etchant (e.g., WF$_6$) applied at, or substantially at, the GR$_C$, according to FIG. 7.

Referring to FIGS. 2A, 14B, and 14C, which corresponds to FIGS. 9B and 10, respectively, the method 140 at operation 144 performs the second etching process 314 to remove the tungsten-containing nitride layer 230 from the first trenches 216A-216B and the second trenches 226A-226D, resulting in the first trenches 216A-216B and the second trenches 226A-226D to have a desired depth, such as the depth H7. The first etching process 312 and the second etching process 314 may be applied in a manner similar to that described above.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/ or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method, comprising:
   providing a semiconductor substrate having a first region and a second region;
   forming a stack of dielectric layers over the semiconductor substrate;
   patterning the stack to form first trenches over the first region and second trenches over the second region, comprising:
   performing a first etching process to form the first and the second trenches to different depths;
   performing a second etching process using a tungsten-containing etchant to deepen the first and the second trenches to the same depth, thereby forming a tungsten-containing nitride layer in the first and the second trenches; and
   performing a third etching process to remove the tungsten-containing nitride layer; and
   forming first conductive features having a first width in the first trenches and second conductive features having a second width in the second trenches, the second width being less than the first width,
   wherein the performing of the first etching process forms the first trenches at a first rate and the second trenches at a second rate that is less than the first rate.

2. The method of claim 1, wherein the forming of the stack includes forming alternating oxide layers and nitride layers.

3. The method of claim 2, wherein the performing of the first etching process exposes a first nitride layer in the first trenches and a second nitride layer in the second trenches, and wherein the tungsten-containing etchant reacts with the first and the second nitride layers to form the tungsten-containing nitride layer.

4. The method of claim 1, wherein the performing of the first etching process includes applying the tungsten-containing etchant at a first flow rate and performing of the second etching process includes applying the tungsten-containing etchant at a second flow rate, the second flow rate being greater than the first flow rate.

5. The method of claim 4, wherein the first flow rate is zero.

6. The method of claim 1, wherein the tungsten-containing etchant includes $WF_6$, and wherein the tungsten-containing nitride layer includes $W_2N$.

7. The method of claim 1, wherein the performing of the second etching process forms the first trenches at a third rate and the second trenches at a fourth rate that is the same as the third rate.

8. The method of claim 1, wherein the performing of the third etching process includes applying a noble gas-containing etchant.

9. The method of claim 1, wherein the performing of the first etching process is implemented using an etchant including a fluorocarbon-based gas, a hydrofluorocarbon-based gas, or both.

10. The method of claim 1, further comprising repeating the performing of the first etching process, the second etching process, and the third etching process before forming the first and the second conductive features.

11. The method of claim 1, further comprising forming a first patterned mask and a second patterned mask over the stack in the first region and the second region, respectively, before the patterning of the stack, such that the performing of the first etching process is implemented using the first and the second patterned masks as etch masks, the first and the second patterned masks including an amorphous carbon layer.

12. The method of claim 1, further comprising forming a first patterned mask and a second patterned mask over the stack in the first region and the second region, respectively, before the patterning of the stack, such that the performing of the first etching process is implemented using the first and the second patterned masks as etch masks, the first and the second patterned masks including tungsten silicide (WSi), tungsten silicon nitride (WSiN), or both.

13. A method, comprising:

providing a semiconductor substrate having a first region and a second region;

forming a stack of alternating oxide layers and nitride layers over the semiconductor substrate;

performing a first etching process to the stack to form first trenches over the first region and second trenches over the second region, the first and the second trenches having different depths, wherein the first etching process is implemented using a first etchant;

performing a second etching process using a second etchant different from the first etchant to deepen the first and the second trenches to the same depth, thereby forming a tungsten nitride ($W_2N$)-containing layer in the first and the second trenches, wherein the second etchant includes a $WF_6$-containing plasma;

performing a third etching process to remove the $W_2N$-containing layer; and forming first conductive features having a first width in the first trenches and second conductive features having a second width in the second trenches, the second width being less than the first width, wherein performing the first etching process forms the first trenches at a first rate and the second trenches at a second rate that is less than the first rate.

14. The method of claim 13, wherein the first etchant is free of the $WF_6$-containing plasma.

15. The method of claim 13, further comprising repeating the performing of the first etching process, the second etching process, and the third etching process before forming the first and the second conductive features.

\* \* \* \* \*